(12) United States Patent
Mizutani et al.

(10) Patent No.: US 9,685,565 B2
(45) Date of Patent: Jun. 20, 2017

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventors: Masaharu Mizutani, Kanagawa (JP); Masao Inoue, Kanagawa (JP); Hiroshi Umeda, Kanagawa (JP); Masaru Kadoshima, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/470,719

(22) Filed: Aug. 27, 2014

(65) Prior Publication Data

US 2015/0060991 A1  Mar. 5, 2015

Related U.S. Application Data

(60) Provisional application No. 61/874,345, filed on Sep. 5, 2013.

(51) Int. Cl.
*H01L 29/792* (2006.01)
*H01L 29/51* (2006.01)
(Continued)

(52) U.S. Cl.
CPC ...... *H01L 29/792* (2013.01); *H01L 21/02148* (2013.01); *H01L 21/02178* (2013.01);
(Continued)

(58) Field of Classification Search
CPC ... H01L 29/792; H01L 29/511; H01L 29/517; H01L 29/66833; H01L 21/28229;
(Continued)

(56) References Cited

U.S. PATENT DOCUMENTS 7,053,448 B2 * 5/2006 Jeon ............... H01L 21/02164
257/324
2004/0264236 A1  12/2004 Chae et al.
(Continued)

FOREIGN PATENT DOCUMENTS

| JP | 2004-336044 A | 11/2004 |
| JP | 2008-244163 A | 10/2008 |
| JP | 2010-010566 A | 1/2010 |

OTHER PUBLICATIONS

Tomida et al., "Dielectric constant enhancement due to Si incorporation into $HfO_2$,", Applied Physics Letters, 2006 American Institute of Physics, vol. 89, No. 14, pp. 142902-1-142902-3.
(Continued)

*Primary Examiner* — Moazzam Hossain
*Assistant Examiner* — Farun Lu
(74) *Attorney, Agent, or Firm* — Shapiro, Gabor and Rosenberger, PLLC

(57) ABSTRACT

The performance of a semiconductor device having a memory element is improved. An insulating film, which is a gate insulating film for a memory element, is formed on a semiconductor substrate, and a gate electrode for the memory element is formed on the insulating film. The insulating film has a first insulating film, a second insulating film thereon, and a third insulating film thereon. The second insulating film is a high-dielectric constant insulator film having a charge accumulating function and contains hafnium, silicon, and oxygen. Each of the first insulating film and the third insulating film has a band gap larger than the band gap of the second insulating film.

8 Claims, 23 Drawing Sheets

(51) Int. Cl.
*H01L 29/66* (2006.01)
*H01L 21/28* (2006.01)
*H01L 21/02* (2006.01)
*H01L 29/423* (2006.01)

(52) U.S. Cl.
CPC .. *H01L 21/02318* (2013.01); *H01L 21/02359* (2013.01); *H01L 21/28229* (2013.01); *H01L 21/28282* (2013.01); *H01L 29/4234* (2013.01); *H01L 29/511* (2013.01); *H01L 29/513* (2013.01); *H01L 29/517* (2013.01); *H01L 29/66833* (2013.01)

(58) Field of Classification Search
CPC ......... H01L 21/02178; H01L 21/02148; H01L 21/02359; H01L 21/02318; H01L 21/28282; H01L 29/4234; H01L 29/513
See application file for complete search history.

(56) References Cited

U.S. PATENT DOCUMENTS

| | | | |
|---|---|---|---|
| 2005/0205920 A1 | 9/2005 | Jeon et al. | |
| 2006/0180851 A1* | 8/2006 | Lee | H01L 21/28273 257/315 |
| 2007/0166931 A1* | 7/2007 | Park | H01L 21/28185 438/287 |
| 2008/0237688 A1* | 10/2008 | Yasuda | H01L 21/28282 257/316 |
| 2008/0303119 A1* | 12/2008 | Watanabe | H01L 29/517 257/632 |
| 2009/0068808 A1 | 3/2009 | Chae et al. | |
| 2009/0127611 A1 | 5/2009 | Park et al. | |
| 2009/0152621 A1 | 6/2009 | Polishchuk et al. | |
| 2010/0025754 A1 | 2/2010 | Shiba | |
| 2011/0241101 A1* | 10/2011 | Ino | B82Y 10/00 257/325 |
| 2013/0307513 A1* | 11/2013 | Then | H01L 29/66469 323/311 |

OTHER PUBLICATIONS

Yim et al., "Effect of Incorporated Nitrogen on the Band Alignment of Ultrathin Silicon-oxynitride Films as a Function of the Plasma Nitridation Conditions", Journal of the Korean Physical Society, vol. 58, No. 5, May 13, 2011, pp. 1169~1173.

Ikarashi et al., "Electron energy-loss spectroscopy analysis of the electronic structure of nitrided Hf silicate films", Applied Physics Letters, American Institute of Physics, vol. 84, No. 18, May 3, 2004, pp. 3672~3674.

Extended European Search Report issued Jan. 23, 2015, in European Patent Application No. 14181035.8.

* cited by examiner

| Operation \ Applied Voltage | Vd | Vcg | Vmg | Vs | Vb |
|---|---|---|---|---|---|
| Program | Vdd | 1V | 12V | 6V | 0 |
| Erase | 0 | 0 | −6V | 6V | 0 |
| Read | Vdd | Vdd | 0 | 0 | 0 |

Vdd = 1.5V

SEMICONDUCTOR DEVICE AND METHOD OF MANUFACTURING THE SAME

CROSS-REFERENCE TO RELATED APPLICATION

The present application claims the benefit of U.S. Provisional Application No. 61/874,345 filed on Sep. 5, 2013, which is incorporated herein by reference in its entirety.

TECHNICAL FIELD

The present invention relates to a semiconductor device and a method of manufacturing the same and can be suitably utilized, for example, in a semiconductor device having a memory element and a method of manufacturing the semiconductor device.

BACKGROUND

As an electrically programmable and erasable non-volatile semiconductor device, EEPROM (Electrically Erasable and Programmable Read Only Memory) is widely used. Storage devices typified by a currently widely-used flash memory has an electrically-conductive floating gate electrode or a trap insulating film surrounded by an oxide film below a gate electrode of a MISFET, a charge accumulated state in the floating gate or the trap insulating film serves as stored information, and it is read as a threshold value of the transistor. The trap insulating film serves as an insulating film which can accumulate charge, and examples thereof include a silicon nitride film. The threshold value of the MISFET (Metal Insulator Semiconductor Field Effect Transistor) is shifted by injection/release of charge into/from such a charge accumulating region to operate it as a storage element. When a trap insulating film such as a silicon nitride film is used as the charge accumulating region, as compared with a case in which an electrically-conductive floating gate film is used as the charge accumulating region, there are such advantages as that the reliability of data retention is excellent since charge is discretely accumulated, oxide films above/below the silicon nitride film can be thinned since the reliability of data retention is excellent, and the voltages of programming/erasing operations can be reduced.

Japanese Patent Application Laid-Open Publication No. 2008-244163 (Patent Document 1) describes a technique about a memory cell of a non-volatile memory in which, on a channel region, a tunnel insulating film 102 formed of a silicon oxynitride film, a charge accumulating layer 103 formed of a hafnium oxynitride film, and a block insulating film 104 formed of an alumina film are sequentially disposed, and a control gate electrode 105 is disposed on the block insulating film 104.

Japanese Patent Application Laid-Open Publication No. 2004-336044 (Patent Document 2) describes, in FIG. 2, etc., a technique in which a gate stack is provided on a channel region, and the gate stack is formed by sequentially stacking a tunneling oxide film 42 formed of a silicon oxide film, a first trapping material film 44 formed of, for example, $HfO_2$, a first insulating film 46 formed of an aluminum oxide, and a gate electrode 48. Moreover, FIG. 3 etc. describe a technique in which a first oxide film 50 which is an aluminum oxide film is provided between the tunneling oxide film 42 and the first trapping material film 44, a second insulating film 52 which is an aluminum oxide film is provided between the first trapping material film 44 and the first insulating film 46, and the first insulating film 46 is formed of, for example, $HfO_2$.

Japanese Patent Application Laid-Open Publication No. 2010-10566 (Patent Document 3) describes, in FIG. 6 etc., a technique of forming a gate electrode by sequentially forming, on a silicon substrate 23, a silicon oxide film 25, an aluminum oxide film 27, a LaHfO film 28, an aluminum oxide film 29, and a poly-Si film 30 for a gate electrode and then processing a stacked film thereof using the lithography technique and the RIE technique.

SUMMARY

The above and other preferred aims and novel characteristics of the present invention will be apparent from the description of the present specification and the accompanying drawings.

The typical ones of the inventions disclosed in the present application will be briefly described as follows.

According to an embodiment, a semiconductor device includes a memory element, and a gate insulating film for the memory element has a first insulating film, a second insulating film on the first insulating film, and a third insulating film on the second insulating film. The second insulating film is a high-dielectric constant insulator film having a charge accumulating function and contains hafnium, silicon, and oxygen. Each of the first insulating film and the third insulating film has a band gap larger than that of the second insulating film.

Moreover, according to an embodiment, a method of manufacturing a semiconductor device including a memory element includes a step of forming a stacked film for forming a gate insulating film of the memory element on the semiconductor device and a step of forming a gate electrode for the memory element on the stacked film. The stacked film is a stacked film of a first insulating film, a second insulating film on the first insulating film, and a third insulating film on the second insulating film. The second insulating film is a high-dielectric constant (high-k; high-K) insulator film having a charge accumulating function and contains hafnium, silicon, and oxygen. Each of the first insulating film and the third insulating film has a band gap larger than that of the second insulating film.

According to the embodiments, the performance of the semiconductor device can be improved.

BRIEF DESCRIPTIONS OF THE DRAWINGS

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

In some drawings used in the embodiments, even in a cross-sectional view, hatching may be omitted in order to facilitate viewing of the drawings. Even in a plan view, hatching may be given in order to facilitate viewing of the drawings.

First Embodiment

About Structure of Semiconductor Device

Figure 1:
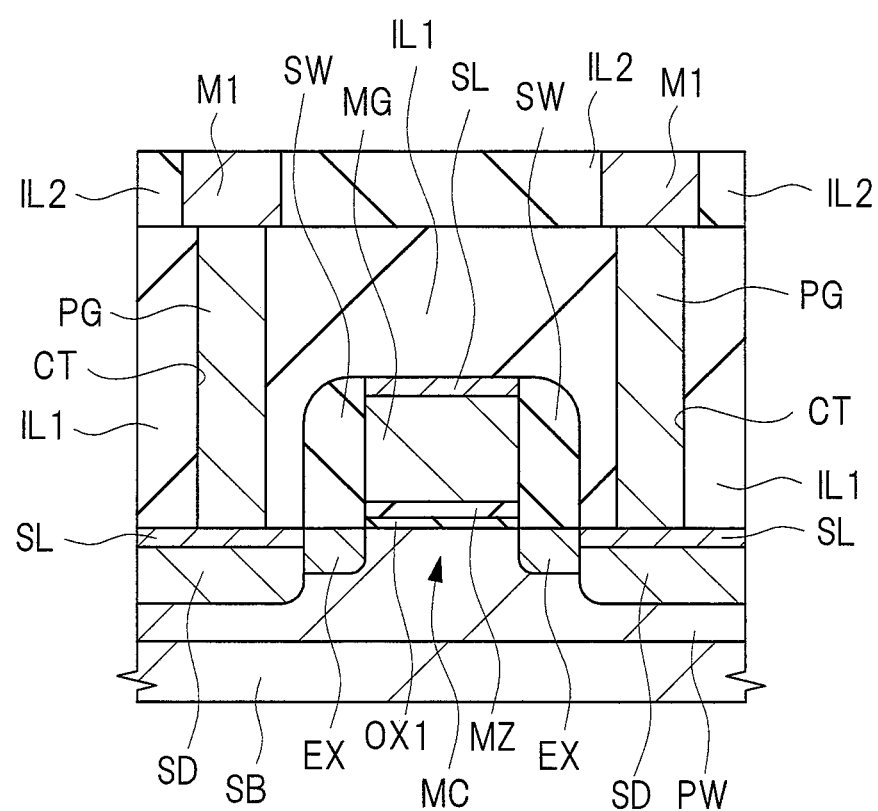
FIG. 1 is a cross-sectional view of main parts of a semiconductor device of an embodiment.
Figure 2:
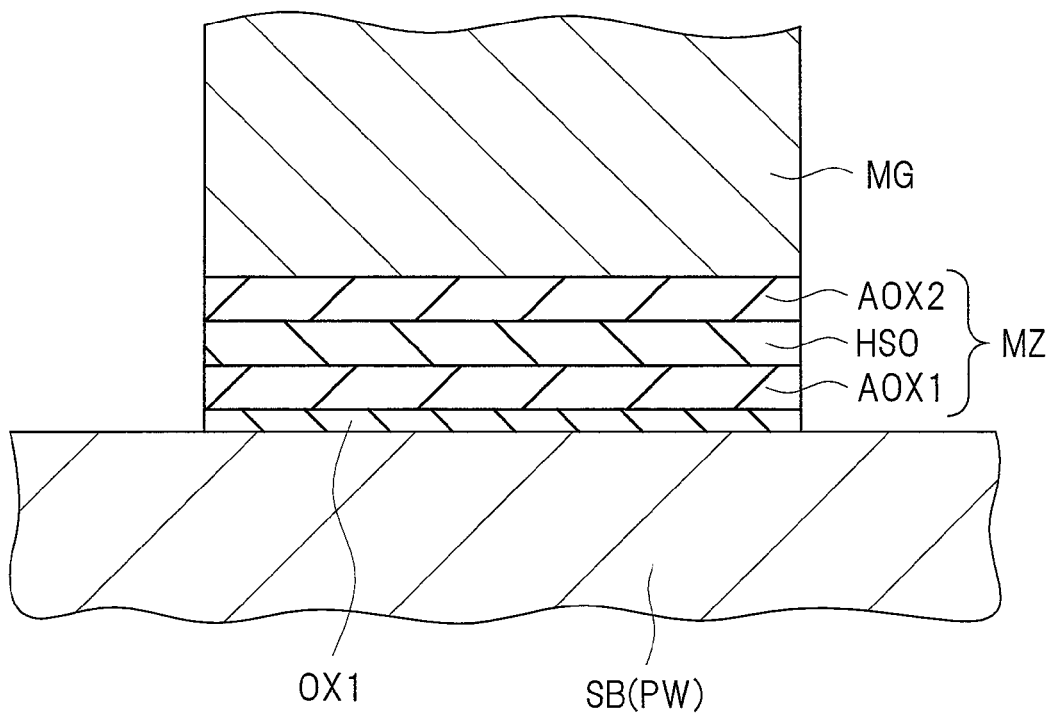
FIG. 2 is a partial enlarged cross-sectional view of the semiconductor device of FIG. 1.

A semiconductor device of the present embodiment will be explained with reference to the drawings. FIG. 1 is a cross-sectional view of main parts of the semiconductor device of the present embodiment. FIG. 2 is a partial enlarged cross-sectional view showing part of the semiconductor device of FIG. 1 in an enlarged manner.

The semiconductor device of the present embodiment is a semiconductor device provided with a non-volatile memory (non-volatile storage element, flash memory, non-volatile semiconductor storage device). FIG. 1 illustrates a cross-sectional view of main parts of a memory-element formation region which is a region in which a memory element (storage element) MC constituting the non-volatile memory is formed. FIG. 1 illustrates a cross section perpendicular to the extending direction of a gate electrode MG composing a memory element MC (direction perpendicular to the paper surface of FIG. 1). FIG. 2 illustrates a semiconductor substrate SB, the gate electrode MG, and insulating films MZ and OX1 therebetween in FIG. 1 in an enlarged manner.

The memory element MC uses a trap insulating film (insulating film which can accumulate charge) in a charge accumulating part. The memory element MC will be explained as an n-channel-type transistor (in other words, an n-channel-type MISFET). However, a p-channel-type transistor (in other words, a p-channel-type MISFET) can be used by reversing the conductivity type thereof.

As shown in FIG. 1, an isolation region (not illustrated) for isolating the element is formed in the semiconductor substrate (semiconductor wafer) SB formed of, for example, p-type single crystal silicon having a specific resistance of about 1 to 10 Ωcm, and a p-type well PW is formed in an active region isolated (defined) by the isolation region. The p-type well is a p-type semiconductor region into which a p-type impurity is introduced. The p-type well PW is mainly formed in the semiconductor substrate SB that is in the memory-element formation region. In the p-type well PW in the memory-element formation region, the memory element MC as shown in FIG. 1 is formed.

Hereinafter, the configuration of the memory element MC formed in the memory-element formation region will be explained in detail.

As shown in FIG. 1, the memory element MC has the insulating film MZ formed on the semiconductor substrate SB (in other words, on the p-type well PW), the gate electrode MG formed on the insulating film MZ, sidewall spacers SW formed on sidewalls of the gate electrode MG, and n-type semiconductor regions (EX, SD) for a source or a drain formed in the p-type well PW of the semiconductor substrate SB. Thus, the gate electrode MG is formed on the surface of the p-type well PW via the insulating film MZ, which functions as a gate insulating film having the charge accumulating part.

The insulating film MZ is interposed between the semiconductor substrate SB (p-type well PW) and the gate electrode MG. While the insulating film MZ is a film which functions as a gate insulating film, it is an insulating film having the charge accumulating part therein. The insulating film MZ is a stacked insulating film in which a plurality of insulating films are stacked. Specifically, the insulating film MZ is formed of a stacked film of an aluminum oxide film AOX1 (first insulating film, a bottom insulating film), a hafnium silicate film HSO (second insulating film) formed on the aluminum oxide film AOX1, and an aluminum oxide film AOX2 (third insulating film, top insulating film) formed on the hafnium silicate film HSO. All of the aluminum oxide film AOX1, the hafnium silicate film HSO, and the aluminum oxide film AOX2 are insulating films.

In the insulating film MZ formed of the stacked film of the aluminum oxide film AOX1, the hafnium silicate film HSO, and the aluminum oxide film AOX2, the aluminum oxide film AOX1 can be considered as a bottom insulating film, and the aluminum oxide film AOX2 can be considered as a top insulating film. Therefore, the insulating film MZ has a structure in which the hafnium silicate film HSO is interposed between the aluminum oxide film AOX1 that is the bottom insulating film, and the aluminum oxide film AOX2 that is the top insulating film.

The insulating film MZ can be directly formed on the surface (silicon surface) of the semiconductor substrate SB (p-type well PW) (in other words, an interface layer OX1 can be omitted). However, it is more preferable that the insulative interface layer (insulation layer, insulating film) OX1 formed of a thin silicon oxide film or silicon oxynitride film be provided at the interface between the insulating film MZ and the semiconductor substrate SB (p-type well PW), in other words, the interface between the aluminum oxide film AOX1 and the semiconductor substrate SB (p-type well PW). More specifically, it is more preferable that the interface layer OX1 formed of the thin silicon oxide film or silicon oxynitride film be interposed between the insulating film MZ and the semiconductor substrate SB (p-type well PW). When the interface layer OX1 formed of silicon oxide or silicon oxynitride is provided, the interface between the gate insulating film and (the silicon surface of) the semiconductor substrate has such a structure of $SiO_2/Si$ or $SiON/Si$, the number of defects of trap levels etc. in the interface can be reduced, and drive performance and reliability can be improved.

In order to facilitate viewing of the drawing, in FIG. 1, the insulating film MZ formed of a stacked film of the aluminum oxide film AOX1, the hafnium silicate film HSO, and the aluminum oxide film AOX2 is simply shown as the insulating film MZ. In practice, as shown in the enlarged view of FIG. 2, the insulating film MZ is formed of the stacked film of the aluminum oxide film AOX1, the hafnium silicate film HSO, and the aluminum oxide film AOX2.

In the insulating film MZ, the hafnium silicate film HSO is an insulating film having a charge accumulating function. More specifically, in the insulating film MZ, the hafnium silicate film HSO is an insulating film for accumulating charge and functions as a charge accumulating layer (charge accumulating part). In other words, the hafnium silicate film HSO is a trap insulating film formed in the insulating film MZ. In this manner, in the present embodiment, the hafnium silicate film HSO is employed as the insulating film (charge accumulating layer) having a trap level. Therefore, the insulating film MZ can be considered as an insulating film having a charge accumulating part (in this case, the hafnium silicate film HSO) therein.

In the insulating film MZ, the aluminum oxide film AOX2 and the aluminum oxide film AOX1 positioned above/below the hafnium silicate film HSO can function as charge block layers or charge confinement layers. Since the insulating film MZ between the gate electrode MG and the semiconductor substrate SB (p-type well PW) has a structure in which the hafnium silicate film HSO is sandwiched between the aluminum oxide film AOX2 and the aluminum oxide film AOX1, charge can be accumulated in the hafnium silicate film HSO.

The insulating film MZ formed in the memory-element formation region functions as a gate insulating film of the memory element MC and has a charge retaining (charge accumulating) function. Therefore, the insulating film MZ has a stacked structure of at least three layers so as to be able to function as the gate insulating film having the charge retaining function of a memory transistor, and the potential barrier height of the inner layer (in this case, the hafnium silicate film HSO) which functions as the charge accumulating part becomes lower than the potential barrier heights of the outer layers (in this case, the aluminum oxide films AOX1 and AOX2) which function as charge block layers. This can be achieved when the insulating film MZ is a stacked film having the aluminum oxide film AOX1, the hafnium silicate film HSO on the aluminum oxide film AOX1, and the aluminum oxide film AOX2 on the hafnium silicate film HSO like the present embodiment.

The insulating film MZ has the stacked structure in which the charge accumulating layer (in this case, the hafnium silicate film HSO) is sandwiched by the top insulating film and the bottom insulating film. Here, the aluminum oxide film AOX2 is used as the top insulating film, and the aluminum oxide film AOX1 is used as the bottom insulating film. Instead of the aluminum oxide film AOX2, a silicon oxide film, a silicon oxynitride film (SiON film), an aluminum oxynitride film (AlON film), an aluminum silicate film (AlSiO film), or a hafnium aluminate film (HfAlO film) can be used as the top insulating film of the insulating film MZ. Also, instead of the aluminum oxide film AOX1, a silicon oxide film, a silicon oxynitride film (SiON film), an aluminum oxynitride film (AlON film), an aluminum silicate film (AlSiO film), or a hafnium aluminate film (HfAlO film) can be used as the bottom insulating film of the insulating film MZ.

The band gap of each of the top insulating film and the bottom insulating film of the insulating film MZ has to be larger than the band gap of the charge accumulating layer (in this case, the hafnium silicate film HSO) between the top insulating film and the bottom insulating film. As a result, each of the top insulating film and the bottom insulating film can function as the charge block layer (or the charge confinement layer). Each of an aluminum oxide film, a silicon oxide film, a silicon oxynitride film (SiON film), an aluminum oxynitride film (AlON film), an aluminum silicate film (AlSiO film), and a hafnium aluminate film (HfAlO film) has a band gap larger than the band gap of the hafnium silicate film and can be therefore employed as the top insulating film or the bottom insulating film of the insulating film MZ.

However, the aluminum oxide film AOX1 is the most preferable as the bottom insulating film of the insulating film MZ, and the aluminum oxide film AOX2 is the most preferable as the top insulating film of the insulating film MZ. When the aluminum oxide film AOX1 and the aluminum oxide film AOX2 are used as the bottom insulating film and the top insulating film of the insulating film MZ, the bottom insulating film and the top insulating film can function more precisely as the charge block layer (or the charge confinement layer), and the dielectric constants of the bottom insulating film and the top insulating film can be more precisely increased.

Each of the aluminum oxide film AOX1, the hafnium silicate film HSO, and the aluminum oxide film AOX2 is an insulation material film having a higher dielectric constant (relative permittivity) than those of silicon oxides and is a so-called High-k film (high-dielectric constant film, high-dielectric constant insulator film). The High-k film, the high-dielectric constant film, the high-dielectric constant insulator film, or the high-dielectric constant gate insulating film referred to in the present application means a film that has a higher dielectric constant (relative permittivity) than that of silicon oxides ($SiO_x$, typically, $SiO_2$).

All of the aluminum oxide film AOX1, the hafnium silicate film HSO, and the aluminum oxide film AOX2 are high-dielectric constant insulator films, have higher dielectric constants (relative permittivities) than those of silicon oxides, and have high dielectric constants (relative permittivities) also compared with those of silicon nitrides. In other words, each of the aluminum oxide film AOX1, the hafnium silicate film HSO, and the aluminum oxide film AOX2 has a higher dielectric constant (relative permittivity) than those of silicon nitrides.

The hafnium silicate film HSO is formed of an insulation material containing Hf (hafnium), Si (silicon), and O (oxygen) as main components. In other words, the hafnium silicate film HSO is an insulation material film formed of hafnium (Hf), silicon (Si), and oxygen (O) and can be also described as a HfSiO film.

The composition of the hafnium silicate film HSO is as described below. In the hafnium silicate film HSO, the ratio of the number of atoms of Hf (hafnium) to the total number of atoms of Hf (hafnium) and Si (silicon) is within the range of 77 to 91 atomic percent (at. %). In other words, in the hafnium silicate film HSO, the value obtained by dividing the number of the atoms of Hf (hafnium) by the sum of the number of the atoms of Hf (hafnium) and the number of the atoms of Si (silicon) is within the range of 0.77 to 0.91. Thus, in the hafnium silicate film HSO, when the number of the atoms of Hf (hafnium) is $N_{Hf}$ and the number of the atoms of Si (silicon) is $N_{Si}$, $0.77 \leq N_{Hf}/(N_{Hf}+N_{Si}) \leq 0.91$ is satisfied. In other words, when the composition (composition ratio) of the hafnium silicate film HSO is described as $Hf_xSi_yO_z$, $0.77 \leq x/(x+y) \leq 0.91$ is satisfied. Thus, when the atomic ratio (the ratio of the numbers of atoms) of Hf (hafnium), Si (silicon), and O (oxygen) of the hafnium silicate film HSO is x:y:z, $0.77 \leq x/(x+y) \leq 0.91$ is satisfied. Therefore, when the atomic ratio of Hf (hafnium) and Si (silicon) of the hafnium silicate film HSO is x:y, $0.77 \leq x/(x+y) \leq 0.91$ is satisfied. Note that, x, y, and z may be integers or may not be integers. The composition of the hafnium silicate film HSO is set in such a range in order to cause the trap insulating film to be a high-dielectric constant insulator film and to increase a trapped charge density, and that will be explained later in more detail.

The insulating film MZ like this will be summarized as below.

In the present embodiment, the insulating film MZ, which functions as the gate insulating film, is interposed between the semiconductor substrate SB and the gate electrode MG, and the insulating film MZ is a stacked insulating film and has the first insulating film (bottom insulating film), the second insulating film on the first insulating film, and the third insulating film (top insulating film) on the second insulating film. The aluminum oxide film AOX1 corresponds to the first insulating film, the hafnium silicate film HSO corresponds to the second insulating film, and the aluminum oxide film AOX2 corresponds to the third insulating film. The second insulating film, which is an intermediate layer, is a high-dielectric constant insulator film, and it is more preferable that the first insulating film and the third insulating film also be high-dielectric constant insulator films. The second insulating film (in this case, the hafnium silicate film HSO), which is the intermediate layer, is an insulating film having the charge accumulating function and is a so-called trap insulating film. Herein, the trap insulating film refers to an insulating film that can accumulate charge. In the present embodiment, the second insulating film, which is the trap insulating film, contains hafnium (Hf), silicon (Si), and oxygen (O) as constituent elements, and it is preferable that $0.77 \leq x/(x+y) \leq 0.91$ be satisfied when the atomic ratio (the ratio of the numbers of atoms) of hafnium (Hf) and silicon (Si) is x:y. Note that x and y may be integers or may not be integers.

The third insulating film and the first insulating film positioned above and below the second insulating film, which is the trap insulating film, can function as the charge block layers or charge confinement layers for confining charge in the trap insulating film. Therefore, it is desired that the band gap of each of the first insulating film and the third insulating film be larger than the band gap of the second insulating film that is the trap insulating film. When increasing the band gap thereof to be larger than that of the second insulating film containing hafnium (Hf), silicon (Si), and oxygen (O) as constituent elements is taken into consideration, the first insulating film and the third insulating film can employ, for example, an aluminum oxide film, a silicon oxide film, a silicon oxynitride film, an aluminum oxynitride film, an aluminum silicate film, or a hafnium aluminate film. Among them, the aluminum oxide film is the most preferable as the first insulating film and the third insulating film. Thus, the aluminum oxide film AOX1 is suitable as the first insulating film, and the aluminum oxide film AOX2 is suitable as the third insulating film. The second insulating film, which is the trap insulating film, contains hafnium (Hf), silicon (Si), and oxygen (O) as constituent elements and is further suitable when a hafnium silicate film (in other words, HfSiO film) is used. Therefore, the hafnium silicate film HSO is suitable as the second insulating film.

The gate electrode MG is formed of an electrically-conductive film and is formed of a silicon film in this case, and the silicon film is preferable to be a polysilicon (polycrystalline silicon) film. The silicon film constituting the gate electrode MG is preferable to be a doped polysilicon film to which an n-type impurity is introduced.

As another mode, the gate electrode MG can be a metal gate electrode. In that case, the gate electrode MG is formed of a metal film. As the metal film that constitutes the gate electrode MG, for example, a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, a titanium aluminum (TiAl) film, or an aluminum (Al) film, can be used. The metal film that constitutes the gate electrode MG is an electrically-conductive film that exhibits metal conductivity, is not limited to a single metal film (pure metal film) or an alloy film, and may be a metal compound film (metal nitride film, metal carbide film, or the like) that exhibits metal conductivity. When the gate electrode MG is a metal gate electrode, the gate electrode MG can be formed of a stacked film, wherein the lowermost layer of the stacked film is a metal film (an electrically-conductive film that exhibits metal conductivity). The stacked film can be a stacked film of a plurality of metal films (electrically-conductive films exhibit metal conductivity) or can be a stacked film of a metal film (electrically-conductive film that exhibits metal conductivity) and a silicon film (polycrystalline silicon film) on the metal film. Thus, the gate electrode MG can be formed of a stacked film of a metal film (electrically-conductive film exhibiting metal conductivity) and a silicon film (polycrystalline silicon film) on the metal film.

When the gate electrode MG is the metal gate electrode, there are obtained advantages that a depletion phenomenon of the gate electrode MG is suppressed and that a parasitic capacity is eliminated. Moreover, there is also obtained an advantage that the memory element MC can be downsized (the thickness of the gate insulating film can be reduced).

The sidewall spacers (sidewall insulating films, sidewalls) SW are formed as sidewall insulating films on the sidewalls of the gate electrode MG. The sidewall spacers SW are formed of insulating films and are formed of, for example, silicon oxide films or silicon nitride films or a stacked film thereof.

In the p-type well PW in the memory-element formation region, as source/drain regions (semiconductor regions for a source or a drain) having a LDD (Lightly doped Drain) structure for the memory element MC, $n^-$-type semiconductor regions (extension regions, LDD regions) EX and $n^+$-type semiconductor regions (source/drain regions) SD having an impurity concentration higher than that are formed. The $n^+$-type semiconductor regions SD have the impurity concentration higher than that of the $n^-$-type semiconductor regions EX and a deep junction depth.

The $n^-$-type semiconductor regions EX are formed in a self-aligning manner at the gate electrode MG, and the $n^+$-type semiconductor regions SD are formed in a self-aligning manner at the sidewall spacers SW provided on the sidewalls of the gate electrode MG. Therefore, the low-concentration $n^-$-type semiconductor regions EX are formed below the sidewall spacers SW on the sidewalls of the gate electrode MG, and the high-concentration $n^+$-type semiconductor regions SD are formed in the outer side of the low-concentration $n^-$-type semiconductor regions EX. In other words, the $n^-$-type semiconductor regions EX are positioned below the sidewall spacers SW, which are formed on the sidewalls of the gate electrode MG, and are interposed between a channel formation region and the $n^+$-type semiconductor regions SD.

The region of the semiconductor substrate SB (p-type well PW) below the gate electrode MG is the region in which a channel is formed, in other words, a channel formation region. In the channel formation region below the insulating film MZ below the gate electrode MG, a semiconductor region (a p-type semiconductor region or an n-type semiconductor region) for threshold voltage adjustment is formed in accordance with needs.

In the semiconductor substrate SB (p-type well PW) in the memory-element formation region, the $n^-$-type semiconductor regions EX are formed in the regions which are separated from each other with the channel formation region sandwiched therebetween, and the $n^+$-type semiconductor regions SD are formed in the outer side of the $n^-$-type semiconductor regions EX (in the side away from the channel formation region). In other words, the $n^-$-type semiconductor regions EX are adjacent to the channel formation region, and the $n^+$-type semiconductor regions SD are separated from the channel formation region by the distance of the $n^-$-type semiconductor region EX (separated in a channel-length direction) and are formed at the positions in contact with the $n^-$-type semiconductor regions EX.

It is more preferable that a metal silicide layer SL be formed on the surfaces (upper surfaces) of the $n^+$-type semiconductor regions SD and the gate electrode MG by using a salicide (Salicide: Self Aligned Silicide) technique. The metal silicide layer SL can be, for example, a cobalt silicide layer, a nickel silicide layer, or a platinum-added nickel silicide layer.

As another mode, the case in which the gate electrode MG is the metal gate electrode includes a case in which the metal silicide layer SL can be formed on the gate electrode MG and a case in which it cannot be formed. For example, when the gate electrode MG is a stacked film of a metal film (electrically-conductive film exhibiting metal conductivity) and a silicon film (polycrystalline silicon film) on the metal film, the metal silicide layer SL can be formed on the silicon film by using the salicide technique. On the other hand, when the entire gate electrode MG is formed of a single-layer film or a stacked film of a metal film(s) (electrically-conductive film(s) exhibiting metal conductivity), the metal silicide layer SL is not formed on the gate electrode MG even by use of the salicide technique.

Next, the structure of the layers above the memory element MC will be explained.

An insulating film IL1 serving as an interlayer insulating film is formed on the semiconductor substrate SB so as to cover the gate electrode MG and the sidewall spacers SW. The insulating film IL1 is formed of, for example, a single film of a silicon oxide film or a stacked film of a silicon nitride film and a silicon oxide film that is formed on the silicon nitride film and is thicker than the silicon nitride film. The upper surface of the insulating film IL1 is planarized.

Contact holes (openings, through-holes) CT are formed in the insulating film ILL and electrically-conductive plugs PG are buried as electrical conductor parts (conductor parts for connection) in the contact holes CT.

The plugs PG are formed of a thin barrier conductor film that is formed on the bottoms and sidewalls (side surfaces) of the contact holes CT, and a main conductor film that is formed on the barrier conductor film so as to bury the contact holes CT. However, in order to simplify the drawing, in FIG. 1, the barrier conductor film and the main conductor film (tungsten film) constituting the plugs PG are shown in an integrated manner. The barrier conductor film constituting the plugs PG can be, for example, a titanium film, a titanium nitride film, or a stacked film thereof, and the main conductor film constituting the plugs PG can be a tungsten film.

The contact holes CT and the plugs PG buried therein are formed, for example, above the $n^+$-type semiconductor regions SD and above the gate electrode MG. At the bottoms of the contact holes CT, part of a main surface of the semiconductor substrate SB such as part of (the metal silicide layer SL on the surface of) the $n^+$-type semiconductor region SD, part of (the metal silicide layer SL on the surface of) the gate electrode MG, etc. are exposed. The plugs PG are connected to the exposed parts (exposed parts at the bottoms of the contact holes CT). FIG. 1 illustrates a cross section in which part of (the metal silicide layer SL on the surface of) the $n^+$-type semiconductor regions SD is exposed at the bottoms of the contact holes CT and electrically connected to the plugs PG, which bury the contact holes CT.

Wiring (wiring layer) M1 is formed on the insulating film IL1 in which the plugs PG are buried. The wiring M1 is, for example, damascene wiring (buried wiring) and is buried in wiring grooves provided in an insulating film IL2 that is formed on the insulating film IL1. The wiring M1 is electrically connected to, for example, the $n^+$-type semiconductor region SD or the gate electrode MG via the plug PG. In FIG. 1, as an example of the wiring M1, the wiring M1 which is electrically connected to the $n^+$-type semiconductor regions SD via the plugs PG is shown. Wiring and insulating films in the layers further thereabove are also formed; however, illustration and explanations thereof are omitted herein. The wiring M1 and the wiring in the layer(s) thereabove is not limited to damascene wiring (buried wiring), but can be formed by patterning an electrically-conductive film for wiring, and also can be, for example, tungsten wiring or aluminum wiring.

The memory element MC is a field effect transistor provided with a gate insulating film (in this case, the insulating film MZ) having the charge accumulating part therein. The memory element MC can store information by accumulating or retaining charge in the hafnium silicate film HSO that is the charge accumulating layer (charge accumulating part) in the insulating film MZ.

For example, in a programming operation of the memory element MC, the memory element MC is caused to be in a programmed state by injecting electrons into the hafnium silicate film HSO in the insulating film MZ. In an erasing operation of the memory element MC, the memory element MC is caused to be in an erased state by pulling out electrons from the hafnium silicate film HSO in the insulating film MZ or injecting holes (positive holes) into the hafnium silicate film HSO in the insulating film MZ. In a reading operation of the memory element MC, whether the memory element MC is in the programmed state or the erased state can be discriminated by utilizing the fact that the threshold voltage of the memory element MC is different in the programmed state and the erased state.

<Manufacturing Steps of Semiconductor Device>

Next, a method of manufacturing the semiconductor device of the present embodiment will be explained.

Figure 3:
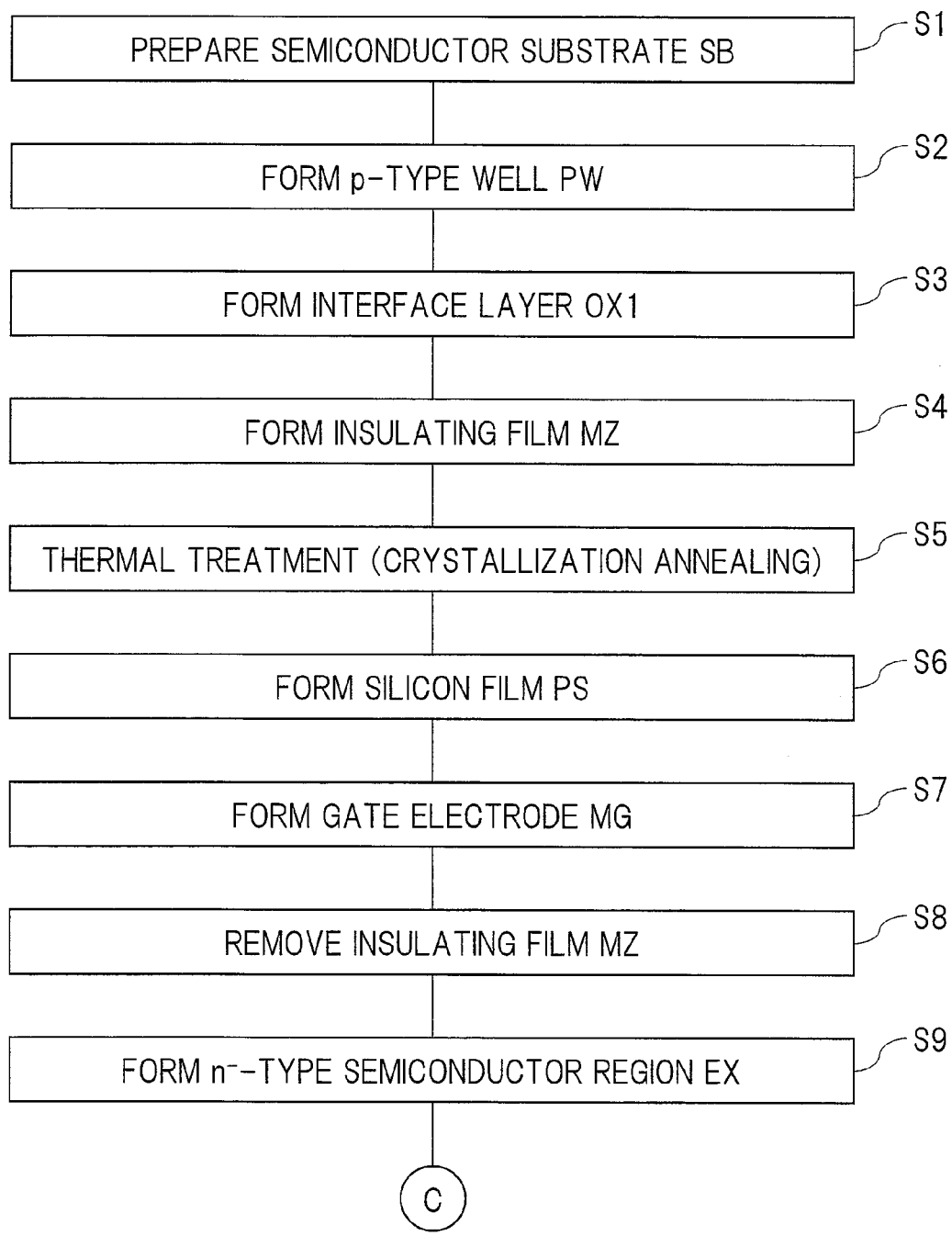
FIG. 3 is a process flow chart showing part of manufacturing steps of the semiconductor device of the embodiment.
Figure 4:
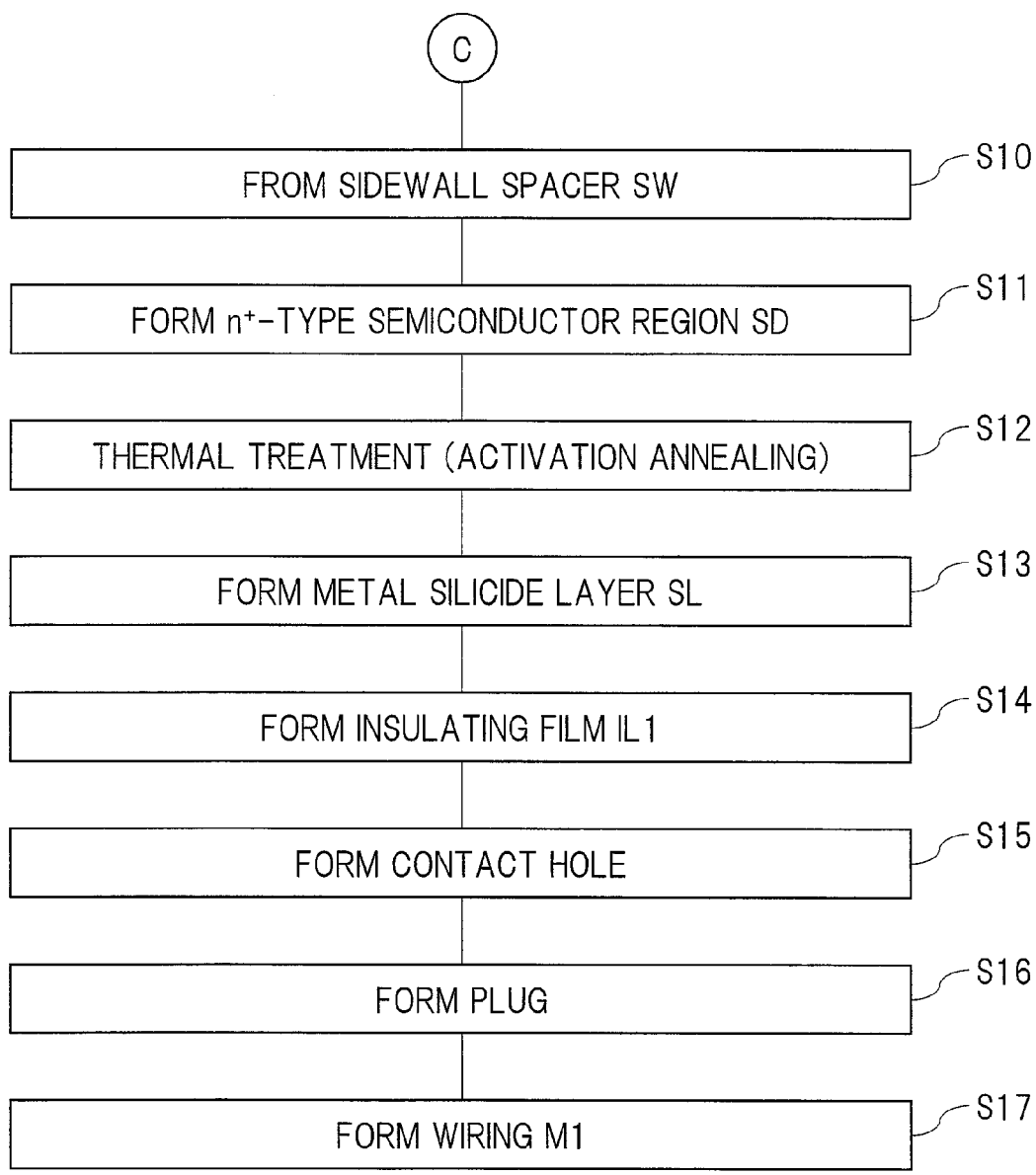
FIG. 4 is a process flow chart showing part of manufacturing steps of the semiconductor device of the embodiment.

FIG. 3 and FIG. 4 are process flow charts showing part of manufacturing steps of the semiconductor device of the present embodiment. FIG. 5 to FIG. 16 are cross-sectional view of main parts during the manufacturing steps of the semiconductor device of the present embodiment and show the cross-sectional views of the region corresponding to that of above-described FIG. 1.

Figure 5:
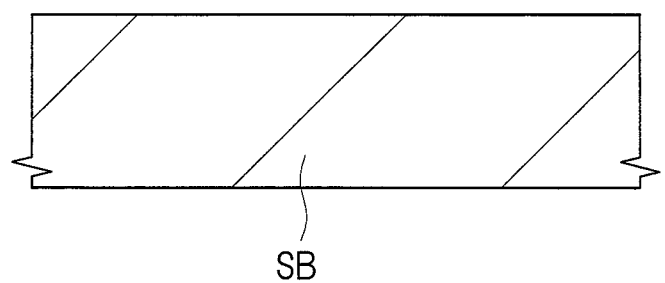
FIG. 5 is a cross-sectional view of main parts during a manufacturing step of the semiconductor device of the embodiment.

In order to manufacture the semiconductor device, as shown in FIG. 5, first, a semiconductor substrate (semiconductor wafer) SB formed of, for example, p-type single-crystal silicon having a specific resistance of about 1 to 10 Ωcm is prepared (provided) (step S1 of FIG. 3). Then, isolation regions (not illustrated) which defines (determines) active regions are formed in the main surface of the semiconductor substrate SB. The isolation regions consist of an insulating film of, for example, a silicon oxide and can be formed by using, for example, STI (Shallow Trench Isolation). For example, after grooves for isolation are formed in the main surface of the semiconductor substrate SB, the isolation regions can be formed by burying the insulating film formed of, for example, a silicon oxide in the grooves for isolation.

Figure 6:
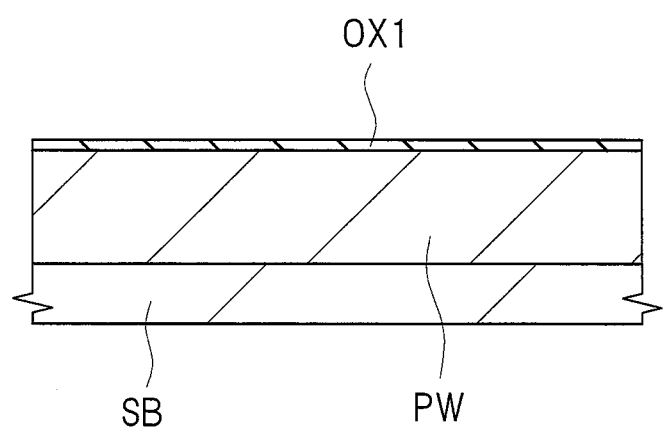
FIG. 6 is a cross-sectional view of main parts during a manufacturing step of the semiconductor device continued from FIG. 5.

Then, as shown in FIG. 6, the p-type well PW is formed in the semiconductor substrate SB in the memory-element isolation region (step S2 of FIG. 3).

The p-type well PW can be formed by, for example, ion-implanting a p-type impurity such as boron (B) into the semiconductor substrate SB. The p-type well PW is formed in a predetermined depth from the main surface of the semiconductor substrate SB.

Then, the surface of the semiconductor substrate SB is cleaned and purified by removing a natural oxide film on the surface of the semiconductor substrate SB by, for example, wet etching using a hydrofluoric-acid (HF) aqueous solution. As a result, the surface (silicon surface) of the semiconductor substrate SB (p-type well PW) is exposed.

Then, as an insulation layer, the interface layer (insulation layer, insulating film) OX1 formed of a silicon oxide film or a silicon oxynitride film is formed on the surface of the semiconductor substrate SB, in other words, on the surface of the p-type well PW (step S3 of FIG. 3).

The film thickness of the interface layer OX1 is thin, is preferable to be 0.5 to 2 nm, and can be, for example, about 1 nm. When the interface layer OX1 is a silicon oxide film, the interface layer OX1 can be formed by using, for example, thermal oxidation. When the interface layer OX1 is a silicon oxynitride film, the interface layer OX1 can be formed, for example, by high-temperature short-time oxidation using N2O, O2, and H2 or by a method in which nitriding process (plasma nitriding) is carried out in plasma after a silicon oxide film is formed.

When the insulating film MZ is formed on the interface layer OX1 after the interface layer OX1 is formed in step S3, the interface between the gate insulating film and (the silicon surface of) the semiconductor substrate has a $SiO_2/Si$ or SiON/Si structure, the number of defects of, for example, trap levels at the interface can be reduced, and drive performance and reliability can be improved.

Figure 7:
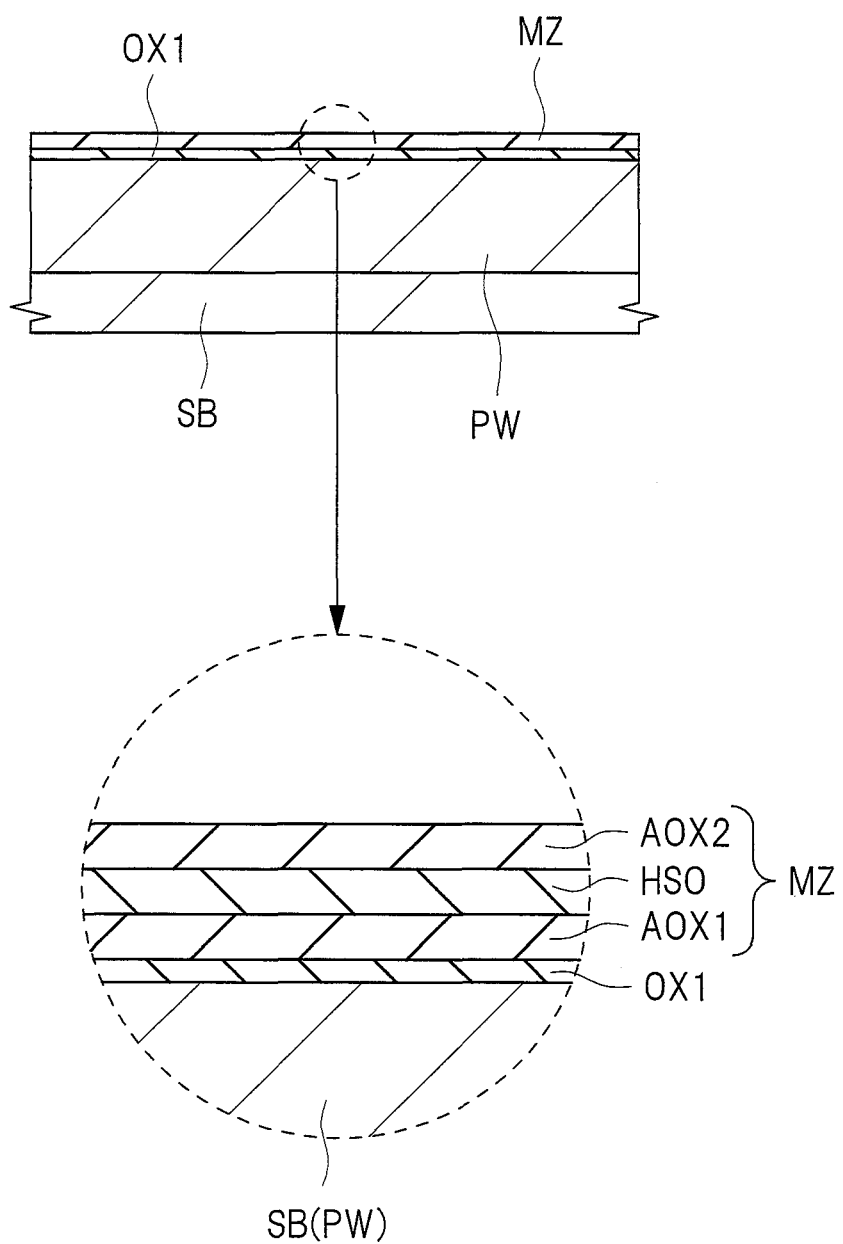
FIG. 7 is a cross-sectional view of main parts during a manufacturing step of the semiconductor device continued from FIG. 6.

Then, as shown in FIG. 7, the insulating film MZ is formed on the main surface of the semiconductor substrate SB, in other words, on the interface layer OX1 (step S4 of FIG. 3). The insulating film MZ is an insulating film for a gate insulating film of the memory element MC and is an insulating film having a charge accumulating part therein.

In order to facilitate viewing of the drawing, in FIG. 7, the insulating film MZ formed of the aluminum oxide film AOX1, the hafnium silicate film HSO, and the aluminum oxide film AOX2 is simply shown as the insulating film MZ. In practice, as shown in an enlarged view of the region surrounded by a dotted-line circle in FIG. 7, the insulating film MZ is formed of a stacked film of the aluminum oxide film AOX1, the hafnium silicate film HSO on the aluminum oxide film AOX1, and the aluminum oxide film AOX2 on the hafnium silicate film HSO.

Therefore, a step of forming the insulating film MZ of step S4 includes a step of forming the aluminum oxide film AOX1, a step of forming the hafnium silicate film HSO, and a step of forming the aluminum oxide film AOX2. In step S4, the step of forming the hafnium silicate film HSO is carried out after the step of forming the aluminum oxide film AOX1, and, further thereafter, the step of forming the aluminum oxide film AOX2 is carried out. Step S4 can be carried out specifically in a below manner.

More specifically, in step S4, first, the aluminum oxide film AOX1 is formed as the first insulating film on the main surface (entire main surface) of the semiconductor substrate SB, in other words, on the interface layer OX1. The aluminum oxide film AOX1 can be formed by using, for example, ALD (Atomic Layer Deposition) or CVD (Chemical Vapor Deposition). The film thickness of the aluminum oxide film AOX1 is preferable to be 1 to 6 nm and can be, for example, about 4 nm. The aluminum oxide film AOX1 is typically an $Al_2O_3$ film, but the atomic ratio of Al (aluminum) and O (oxygen) may be other than 2:3.

Then, in step S4, the hafnium silicate film HSO is formed as the second insulating film on the main surface (entire main surface) of the semiconductor substrate SB, in other words, on the aluminum oxide film AOX1. The hafnium silicate film HSO can be formed by using, for example, ALD or CVD. The film thickness of the hafnium silicate film HSO is preferable to be 2 to 15 nm and can be, for example, about 10 nm.

The film of the hafnium silicate film HSO is an insulation material film formed of hafnium (Hf), silicon (silicon, Si), and oxygen (O) (in other words, a HfSiO film). The film of the hafnium silicate film HSO can be also described as a HfSiO film, wherein the atomic ratio of Hf, Si, and O is not 1:1:1, and $0.77 \leq x/(x+y) \leq 0.91$ is satisfied when the atomic ratio of Hf (hafnium) and Si (silicon) in the hafnium silicate film HSO is x:y.

Then, in step S4, the aluminum oxide film AOX2 is formed as the third insulating film on the main surface (entire main surface) of the semiconductor substrate SB, in other words, on the hafnium silicate film HSO. The aluminum oxide film AOX2 can be formed by using, for example, ALD or CVD. The film thickness of the aluminum oxide film AOX2 is preferable to be 4 to 12 nm and can be, for example, about 8 nm. The aluminum oxide film AOX2 is typically an $Al_2O_3$ film, but the atomic ratio of Al (aluminum) to O (oxygen) may be other than 2:3.

Step S4 is carried out in this manner, and, in the memory-element formation region, a state in which the interface layer OX1, the aluminum oxide film AOX1, the hafnium silicate film HSO, and the aluminum oxide film AOX2 are sequentially stacked from the lower side on the semiconductor substrate SB (p-type well PW) is obtained. All of the aluminum oxide film AOX1, the hafnium silicate film HSO, and the aluminum oxide film AOX2 are high-dielectric constant insulator films, have higher dielectric constants (relative permittivities) than those of silicon oxides, and have higher dielectric constants (relative permittivities) than those of silicon nitrides.

The composition of the hafnium silicate film HSO is as described below. That is, in the hafnium silicate film HSO, the ratio of the number of atoms of Hf (hafnium) to the total number of atoms of Hf (hafnium) and Si (silicon) is within the range of 77 to 91 atomic percent. Thus, in the hafnium silicate film HSO, when the number of the atoms of Hf (hafnium) is $N_{Hf}$ and the number of the atoms of Si (silicon) is $N_{Si}$, $0.77 \leq N_{Hf}/(N_{Hf}+N_{Si}) \leq 0.91$ is satisfied. In other words, when the composition (composition ratio) of the hafnium silicate film HSO is described as $Hf_xSi_yO_z$, $0.77 \leq x/(x+y) \leq 0.91$ is satisfied. Thus, when the atomic ratio of Hf (hafnium), Si (silicon), and O (oxygen) of the hafnium silicate film HSO is x:y:z, $0.77 \leq x/(x+y) \leq 0.91$ is satisfied. Therefore, when the atomic ratio of Hf (hafnium) and Si (silicon) of the hafnium silicate film HSO is x:y, $0.77 \leq x/(x+y) \leq 0.91$ is satisfied. Note that, x, y, and z may be integers or may not be integers.

The composition of the hafnium silicate film HSO can be controlled by, for example, adjusting the type, flow rate, etc. of a gas when the hafnium silicate film HSO is formed.

As described above, in step S4, instead of the aluminum oxide film AOX1, a silicon oxide film, a silicon oxynitride film (SiON film), an aluminum oxynitride film (AlON film), an aluminum silicate film (AlSiO film), or a hafnium aluminate film (HfAlO film) can be formed as the bottom insulating film of the insulating film MZ. Also, instead of the aluminum oxide film AOX2, a silicon oxide film, a silicon oxynitride film (SiON film), an aluminum oxynitride film (AlON film), an aluminum silicate film (AlSiO film), or a hafnium aluminate film (HfAlO film) can be formed as the top insulating film of the insulating film MZ.

Then, thermal treatment (annealing treatment) is carried out (step S5 of FIG. 3). The thermal treatment of step S5 is carried out for crystallizing the films (the aluminum oxide film AOX1, the hafnium silicate film HSO, and the aluminum oxide film AOX2) constituting the insulating film MZ, particularly, for crystallizing the hafnium silicate film HSO. Thus, step S5 is thermal treatment for crystallization and can be considered as crystallization annealing treatment. The hafnium silicate film HSO can be crystallized by the thermal treatment of step S5.

The thermal-treatment temperature of the thermal treatment of step S5 is preferable to be in the range of 800 to 1050° C. and can be, for example, about 950° C., and thermal treatment time can be, for example, about 5 seconds.

The semiconductor substrate SB is subjected to thermal treatment in step S5, and, for example, a lamp annealing apparatus can be used as a thermal treatment apparatus.

As another mode, the thermal treatment (thermal treatment for crystallization) of step S5 can be carried out, for example, immediately after a later-described silicon film PS is formed (in other words, after formation of the later-described silicon film PS and before a patterning step of the silicon film PS), or activation annealing after later-described formation of source/drain regions can also function as that.

However, it is more preferable that the thermal treatment (thermal treatment for crystallization) of step S5 be carried out immediately after formation of the aluminum oxide film AOX2 (in other words, after formation of the aluminum oxide film AOX2 and before formation of the later-described silicon film PS) or be carried out immediately after formation of the hafnium silicate film HSO (in other words, after formation of the hafnium silicate film HSO and before formation of the aluminum oxide film AOX2). By virtue of that, the effect of increasing the trapped charge density of the hafnium silicate film HSO can be further increased.

The thermal treatment of step S5 is carried out for crystallizing the films constituting the insulating film MZ, particularly for crystallizing the hafnium silicate film HSO. Therefore, the thermal treatment has to be carried out at least after the hafnium silicate film HSO is formed.

Figure 8:
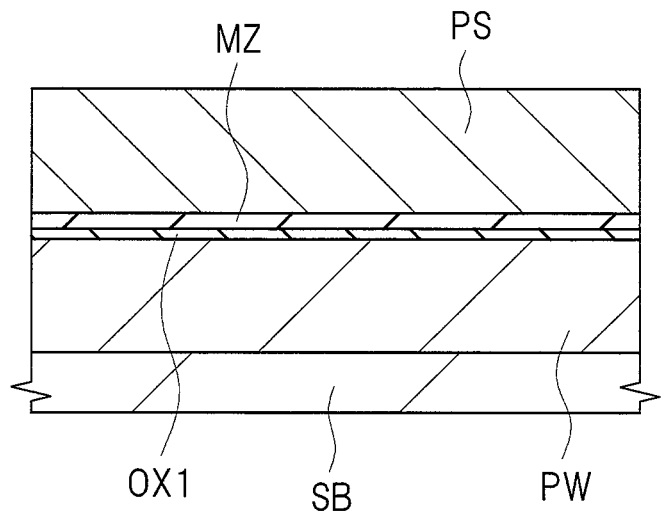
FIG. 8 is a cross-sectional view of main parts during a manufacturing step of the semiconductor device continued from FIG. 7.

Then, as shown in FIG. 8, on the main surface (the entire main surface) of the semiconductor substrate SB, in other words, on the insulating film MZ, the silicon film PS is formed as an electrically-conductive film for forming the gate electrode MG (step S6 of FIG. 3).

The silicon film PS is formed of a polycrystalline silicon film and can be formed by using, for example, CVD. The film thickness of the silicon film PS is preferable to be 30 to 200 nm and can be, for example, about 100 nm. In the film formation, the silicon film PS can be formed as an amorphous silicon film, and the amorphous silicon film can be changed to a polycrystalline silicon film by thermal treatment thereafter.

The silicon film PS undergoes introduction of an impurity and becomes a low-resistance semiconductor film (doped polysilicon film), for example, by introducing the impurity in the film formation or by ion-implanting the impurity after the film formation. The silicon film PS in the memory-element formation region is preferable to be an n-type silicon film into which an n-type impurity such as phosphorous (P) or arsenic (As) is introduced. In a case in which an n-type impurity is introduced in the film formation of the silicon film PS, when a gas for the film formation of the silicon film PS contains a doping gas (gas for adding the n-type impurity), the silicon film PS into which the n-type impurity is introduced can be formed. In a case in which an impurity is introduced by ion implantation into the silicon film PS after the film formation of the silicon film PS, ion implantation is carried out for the entire silicon film PS, or ion implantation can be carried out for the silicon film PS in the memory-element formation region after a photoresist layer serving as an ion-implantation preventing mask is formed on the silicon film PS. In any of the cases, the silicon film PS in the memory-element formation region undergoes introduction of an impurity and becomes a low-resistance semiconductor film.

Figure 9:
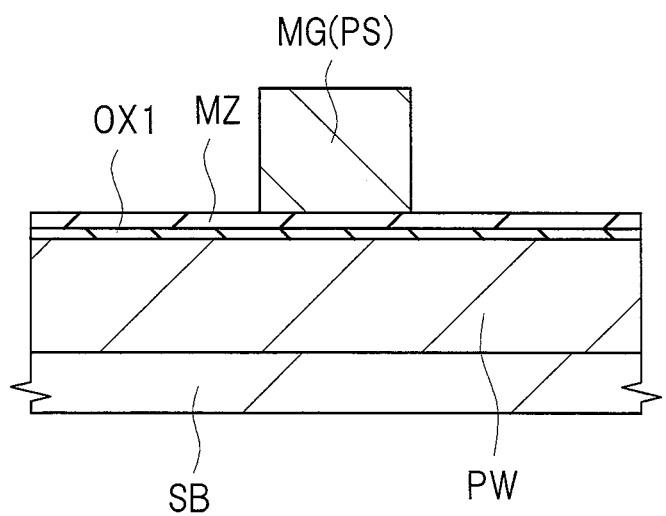
FIG. 9 is a cross-sectional view of main parts during a manufacturing step of the semiconductor device continued from FIG. 8.

Then, as shown in FIG. 9, the gate electrode MG is formed by patterning the silicon film PS by using photolithography techniques and etching techniques (step S7 of FIG. 3). This patterning step of step S7 can be carried out, for example, in a below manner.

That is, first, a photoresist pattern (not illustrated) is formed on the silicon film PS by using photolithography. The photoresist pattern is formed in a region in which the gate electrode MG is to be formed in the memory-element formation region. Then, the silicon film PS is etched (preferably, dry etching) and patterned by using the photoresist pattern as an etching mask. Then, the photoresist pattern is removed, and FIG. 9 illustrates this state.

In this manner, the silicon film PS patterned in step S7, and the gate electrode MG formed of the patterned silicon film PS is formed as shown in FIG. 9. Thus, in the memory-element formation region, the silicon film PS excluding the part that becomes the gate electrode MG is etched and removed, and, as a result, the gate electrode MG is formed. The gate electrode MG is formed on the insulating film MZ. More specifically, the gate electrode MG formed of the patterned silicon film PS is formed on the surface of the p-type well PW via the insulating film MZ (the interface layer OX1 and the insulating film MZ).

As another mode, when the gate electrode MG is a metal gate electrode, instead of the silicon film PS, for example, a metal film is used, or a stacked film of a metal film and a silicon film on the metal film can be used. In this case, the gate electrode MG is the patterned metal film or the patterned stacked film of the metal film and the silicon film on the metal film. The metal film referred to herein is an electrically-conductive film exhibiting metal conductivity, is not limited to a single metal film (pure metal film) or an alloy film, and may be a metal compound film (for example, a metal nitride film or a metal carbide film) exhibiting metal conductivity.

Figure 10:
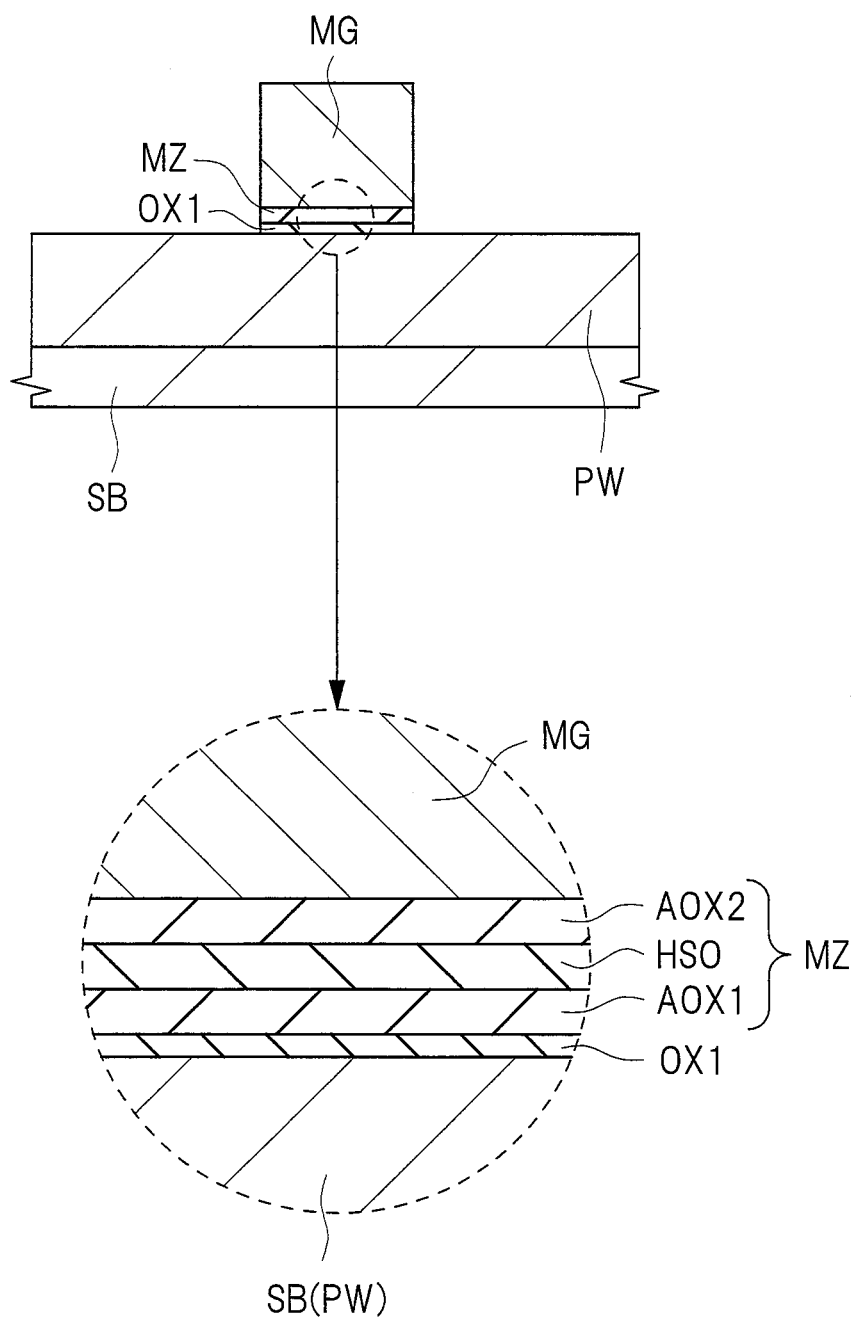
FIG. 10 is a cross-sectional view of main parts during a manufacturing step of the semiconductor device continued from FIG. 9.

Then, as shown in FIG. 10, the part of the insulating film MZ that is exposed without being covered with the gate electrode MG is removed by etching (step S8 of FIG. 3). In step S8, wet etching can be preferably used. As an etching solution, for example, a hydrofluoric-acid solution can be used.

In step S8, the insulating film MZ that is positioned below the gate electrode MG remains without being removed and becomes a high-dielectric constant insulator film of the memory element MC. More specifically, the insulating film MZ remaining below the gate electrode MG becomes a gate insulating film (a gate insulating film having a charge accumulating part) of the memory element MC and functions as the high-dielectric constant gate insulating film. More specifically, in step S8, the insulating film MZ that remains below the gate electrode MG and is interposed between the gate electrode MG and the semiconductor substrate SB (p-type well PW) becomes the gate insulating film (gate insulating film having the charge accumulating part) of the memory element MC and functions as a high-dielectric constant gate insulating film. When the interface layer OX1 has been formed, the interface layer OX1 is interposed between the insulating film MZ, which remains below the gate electrode MG, and the semiconductor substrate SB (p-type well PW), and this stacked film of the interface layer OX1 and the insulating film MZ functions as a gate insulating film of the memory element MC.

Part of the insulating film MZ of the part that is not covered with the gate electrode MG is sometimes etched by dry etching when the silicon film PS is patterned in step S7. More specifically, the insulating film MZ of the part that is not covered with the gate electrode MG is sometimes removed by dry etching in patterning of the silicon film PS in step S7 and etching (preferably, wet etching) in step S8.

In order to facilitate viewing of the drawing, also in FIG. 10, the insulating film MZ formed of the aluminum oxide film AOX1, the hafnium silicate film HSO, and the aluminum oxide film AOX2 is simply shown as the insulating film MZ. In practice, as shown in an enlarged view of the region surrounded by a dotted-line circle in FIG. 10, the insulating film MZ is formed of the stacked film of the aluminum oxide film AOX1, the hafnium silicate film HSO on the aluminum oxide film AOX1, and the aluminum oxide film AOX2 on the hafnium silicate film HSO.

Figure 11:
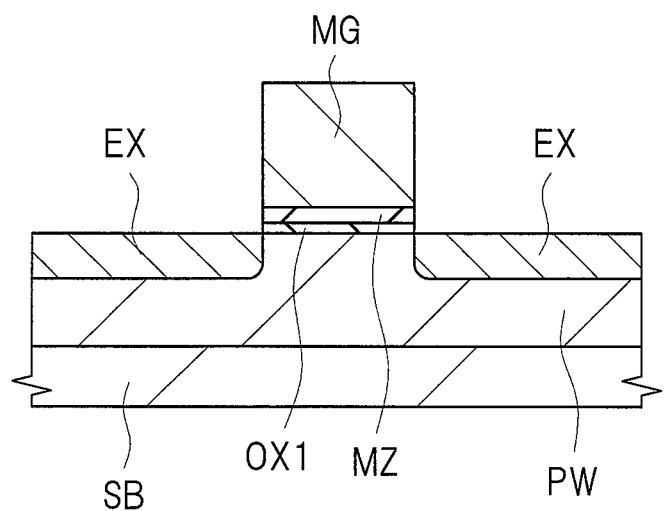
FIG. 11 is a cross-sectional view of main parts during a manufacturing step of the semiconductor device continued from FIG. 10.

Then, as shown in FIG. 11, the n⁻-type semiconductor regions EX are formed in the semiconductor substrate SB (p-type well PW) in the memory-element formation region, for example, by ion implantation (step S9 of FIG. 3).

More specifically, in step S9, the n⁻-type semiconductor regions EX are formed by ion-implanting an n-type impurity such as phosphorous (P) or arsenic (As) into the regions in both sides of the gate electrode MG of the p-type well PW in the memory-element formation region. In the ion implantation for forming the n⁻-type semiconductor regions EX, the gate electrode MG can function as a mask (ion-implantation preventing mask); therefore, the n⁻-type semiconductor regions EX are formed to be self-aligned with the sidewalls of the gate electrode MG. Therefore, in the semiconductor substrate SB (p-type well PW) in the memory-element formation region, the n⁻-type semiconductor regions EX are formed in both sides of the gate electrode MG (both sides of a gate-length direction).

Figure 12:
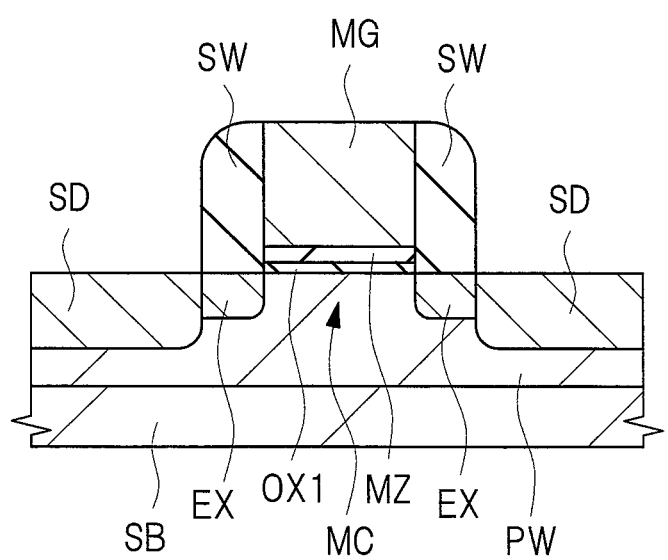
FIG. 12 is a cross-sectional view of main parts during a manufacturing step of the semiconductor device continued from FIG. 11.

Then, as shown in FIG. 12, the sidewall spacers SW formed of an insulating film are formed as a sidewall insulating film on the sidewalls of the gate electrode MG (step S10 of FIG. 4).

The step of forming the sidewall spacers SW of step S10 can be carried out, for example, in the below manner. That is, an insulating film for forming the sidewall spacers SW is formed on the entire main surface of the semiconductor substrate SB so as to cover the gate electrode MG. The insulating film for forming the sidewall spacers SW is formed of, for example, a silicon oxide film or a silicon nitride film or a stacked film thereof and can be formed by using, for example, CVD. Then, the insulating film for forming the sidewall spacers SW is subjected to etch back (etching, dry etching, anisotropic etching) by anisotropic etching techniques. As a result, as shown in FIG. 12, the insulating film for forming the sidewall spacers SW selectively remains on the sidewalls of the gate electrode MG, and the sidewall spacers SW are formed.

Then, the n⁺-type semiconductor regions SD are formed in the semiconductor substrate SB (p-type well PW) in the memory-element formation region, for example, by ion implantation (step S11 of FIG. 4).

More specifically, in step S11, the n⁺-type semiconductor regions SD are formed by ion-implanting an n-type impurity such as phosphorous (P) or arsenic (As) into the regions of the p-type well PW in the memory-element formation region that are in both sides of the gate electrode MG and the sidewall spacers SW. In the ion implantation for forming the n⁺-type semiconductor regions SD, the gate electrode MG and the sidewall spacers SW on the sidewalls thereof can function as a mask (ion-implantation preventing mask); therefore, the n⁺-type semiconductor regions SD are formed to be self-aligned on the side surfaces of the sidewall spacers SW on the sidewalls of the gate electrode MG. Therefore, in the semiconductor substrate SB (p-type well PW) in the memory-element formation region, the n⁺-type semiconductor regions SD are formed in both sides (both sides of the gate-length direction) of the structure formed of the gate electrode MG and the sidewall spacers SW on the sidewalls thereof. The n⁺-type semiconductor regions SD have a higher impurity concentration and a deeper junction depth than those of the n⁻-type semiconductor regions EX.

In this manner, n-type semiconductor regions which function as semiconductor regions for a source or a drain (source/drain regions) of the memory element MC are formed in the semiconductor substrate SB (p-type well PW) in the memory-element formation region by the n⁻-type semiconductor regions EX and the n⁺-type semiconductor regions SD having a higher impurity concentration than that.

The n⁺-type semiconductor regions SD have a higher impurity concentration and deeper junction depth than those of the n⁻-type semiconductor regions EX.

The n-type impurity can be introduced into the silicon film, which constitutes the gate electrode MG, in the ion implanting step for forming the n⁻-type semiconductor regions EX or the ion implanting step for forming the n⁺-type semiconductor regions SD.

Then, activation annealing, which is thermal treatment for activating the impurities introduced into, for example, the semiconductor regions for the source or drain (the n⁻-type semiconductor regions EX and the n⁺-type semiconductor regions SD) (step S12 of FIG. 4). The thermal treatment of step S12 can be carried out in an inactive-gas atmosphere, more preferably, in a nitrogen atmosphere, for example, at a thermal treatment temperature of 900° C. to 1100° C.

In this manner, the memory element MC is formed. The gate electrode MG functions as a gate electrode of the memory element MC, and the insulating film MZ below the gate electrode MG (and the interface layer OX1 therebelow) function as a gate insulating film of the memory element MC. The n-type semiconductor regions (impurity diffusion layer), which function as a source or a drain of the memory element MC, are formed of the n⁺-type semiconductor regions SD and the n⁻-type semiconductor regions EX.

Then, the metal silicide layer SL is formed of a salicide (Salicide: Self Aligned Silicide) process (step S13 of FIG. 4). The metal silicide layer SL can be formed in the below manner.

Figure 13:
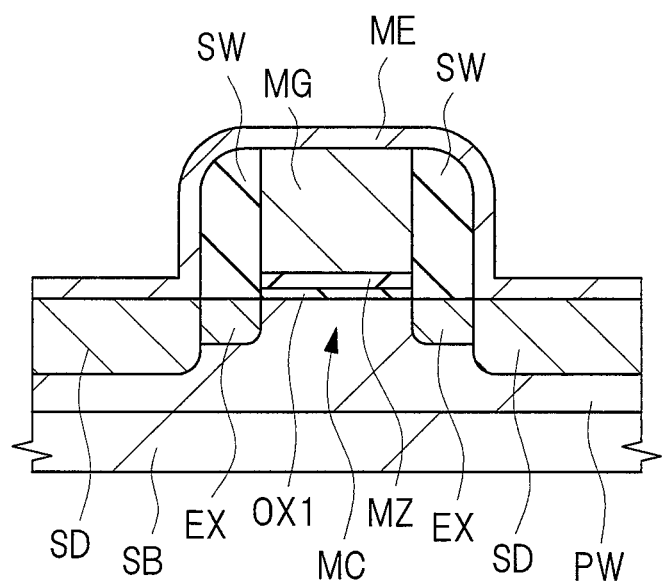
FIG. 13 is a cross-sectional view of main parts during a manufacturing step of the semiconductor device continued from FIG. 12.

First, in accordance with needs, etching (for example, wet etching using diluted hydrofluoric acid or the like) is carried out. By virtue of this, the upper surfaces (surfaces) of the n⁺-type semiconductor regions SD and the upper surface of the gate electrode MG are purified (exposed). The etching in this process can be light etching of a degree that removes a natural oxide film. Then, as shown in FIG. 13, a metal film ME is formed (deposited) on the entire main surface of the semiconductor substrate SB including the upper surfaces (surfaces) of the n⁺-type semiconductor regions SD and the gate electrode MG so as to cover the gate electrode MG and the sidewall spacers SW. The metal film ME can be a single metal film (pure metal film) or an alloy film and is formed of, for example, a cobalt (Co) film, a nickel (Ni) film, or a nickel-platinum alloy film. The metal film ME can be formed by using, for example, sputtering.

Figure 14:
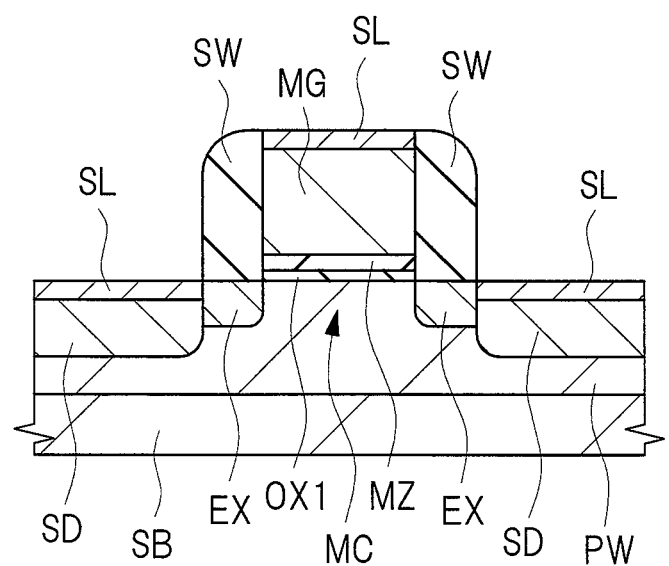
FIG. 14 is a cross-sectional view of main parts during a manufacturing step of the semiconductor device continued from FIG. 13.

Then, the semiconductor substrate SB is subjected to thermal treatment, thereby causing the upper-layer parts (surface-layer parts) of the n⁺-type semiconductor regions SD and the gate electrode MG to react with the metal film ME. As a result, as shown in FIG. 14, the metal silicide layer SL that is a reaction layer of silicon and metal, is formed on each of the upper parts (upper surfaces, surfaces, upper-layer parts) of the n⁺-type semiconductor regions SD and the gate electrode MG. The metal silicide layer SL can be, for example, a cobalt silicide layer (when the metal film ME is a cobalt film), a nickel silicide layer (when the metal film ME is a nickel film), or a platinum-added nickel silicide layer (when the metal film ME is a nickel-platinum alloy film). Herein, platinum-added nickel silicide corresponds to nickel silicide containing platinum, in other words, nickel-platinum silicide. Then, the metal film ME that has been unreacted is removed. FIG. 14 illustrates a cross-sectional view of this stage. After the metal film ME that has been unreacted is removed, thermal treatment can be further carried out.

In this manner, the metal silicide layer SL can be formed by carrying out a so-called salicide process. By forming the metal silicide layer SL on the upper parts of the n$^+$-type semiconductor regions SD and the gate electrode MG, the resistances of the source, the drain, and the gate electrode (for example, diffusion resistance and contact resistance) can be reduced.

When the gate electrode MG is a metal gate electrode and the entire gate electrode MG is formed of metal (conductor exhibiting metal conductivity), the metal silicide layer SL is not formed on the gate electrode MG.

Figure 15:
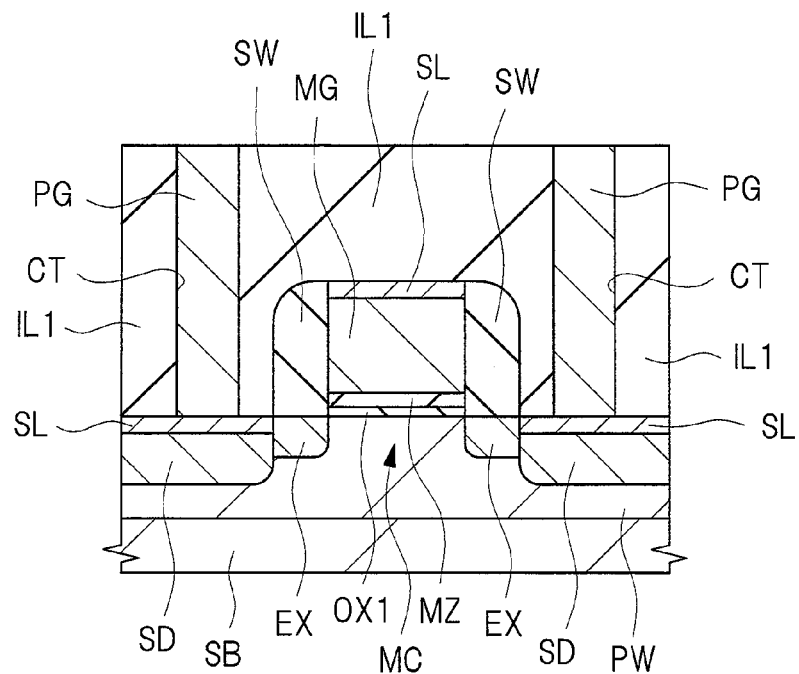
FIG. 15 is a cross-sectional view of main parts during a manufacturing step of the semiconductor device continued from FIG. 14.

Then, as shown in FIG. 15, on the entire main surface of the semiconductor substrate SB, an insulating film (interlayer insulating film) IL1 is formed (deposited) as an interlayer insulating film so as to cover the gate electrode MG and the sidewall spacers SW (step S14 of FIG. 4).

The insulating film IL1 is formed of, for example, a single film of a silicon oxide film or a stacked film of a silicon nitride film and a silicon oxide film that is formed on the silicon nitride film to be thicker than the silicon nitride film, and the insulating film IL1 can be formed by using, for example, CVD. After formation of the insulating film IL1, in accordance with needs, the upper surface of the insulating film IL1 is planarized by using, for example, CMP (Chemical Mechanical Polishing).

Then, the contact holes (openings, through-holes) CT are formed in the insulating film IL1 by dry-etching the insulating film IL1 while using a photoresist pattern (not illustrated), which is formed on the insulating film IL1 by using photolithography, as an etching mask (step S15 of FIG. 4). The contact holes CT are formed so as to penetrate through the insulating film IL1.

Then, the electrically-conductive plugs PG formed of, for example, tungsten (W) are formed as electrical conductor parts for connection in the contact holes CT (step S16 of FIG. 4).

In order to form the plugs PG, for example, a barrier conductor film is formed on the insulating film IL1 including the interiors (on the bottoms and sidewalls) of the contact holes CT. The barrier conductor film is formed of, for example, a titanium film, a titanium nitride film, or a stacked film thereof. Then, after a main conductor film formed of, for example, a tungsten film is formed on the barrier conductor film so as to bury the contact holes CT, the main conductor film and the barrier conductor film which are on the insulating film IL1 and unnecessary are removed by, for example, CMP or etch back; as a result, the plugs PG can be formed. In order to simplify the drawing, in FIG. 15, the barrier conductor film and the main conductor film (tungsten film) constituting the plugs PG are shown in an integrated manner.

The contact holes CT and the plugs PG buried therein are formed, for example, above the n$^+$-type semiconductor regions SD and the gate electrode MG. At the bottoms of the contact holes CT, part of the main surface of the semiconductor substrate SB is exposed. For example, part of (the metal silicide layer SL on the surface of) the n$^+$-type semiconductor regions SD and part of (the metal silicide layer SL on the surface of) the gate electrode MG are exposed. FIG. 15 illustrates a cross section in which part of (the metal silicide layer SL on the surface of) the n$^+$-type semiconductor regions SD is exposed at the bottoms of the contact holes CT and is electrically connected to the plugs PG, which bury the contact holes CT.

Then, the wiring (wiring layer) M1 which is first-layer wiring is formed on the insulating film IL1, in which the plugs PG are buried (step S17 of FIG. 4). A case in which the wiring M1 is formed by using damascene techniques (in this case, single damascene techniques) will be explained.

Figure 16:
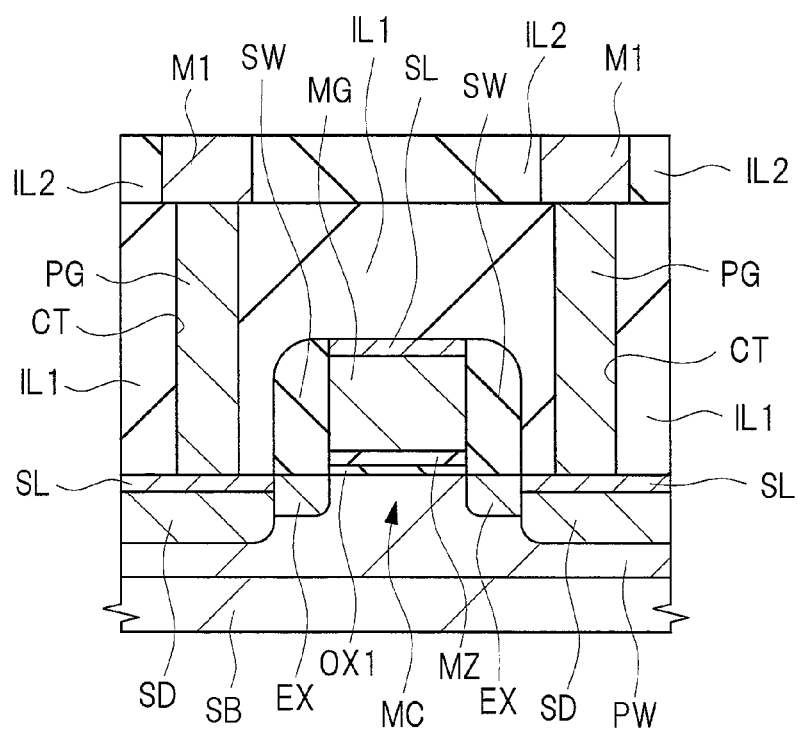
FIG. 16 is a cross-sectional view of main parts during a manufacturing step of the semiconductor device continued from FIG. 15.

First, as shown in FIG. 16, the insulating film IL2 is formed on the insulating film IL1, in which the plugs PG are buried. Then, after wiring grooves (grooves for wiring) are formed in predetermined regions of the insulating film IL2 by dry etching using a photoresist pattern (not illustrated) as an etching mask, a barrier conductor film is formed on the insulating film IL2 including that on the bottoms and sidewalls of the wiring grooves. The barrier conductor film is formed of, for example, a titanium nitride film, a tantalum film, or a tantalum nitride film. Then, a copper seed layer is formed on the barrier conductor film, for example, by CVD or sputtering, and a copper plating film is further formed on the seed layer by using, for example, electrolytic plating to bury the interiors of the wiring grooves with the copper plating film. Then, the main conductor film (the copper film and the seed layer) and the barrier conductor film in the regions excluding the wiring grooves are removed by CMP to form the first-layer wiring M1 employing the copper buried in the wiring grooves as a main electrically-conductive material. In FIG. 16, in order to simplify the drawing, the wiring M1 is shown by integrating the barrier conductor film, the seed layer, and the copper plating film.

The wiring M1 is electrically connected to, for example, the source/drain regions (the n$^+$-type semiconductor regions SD) of the memory element MC and the gate electrode MG of the memory element MC via the plugs PG.

Then, wiring of a second layer and thereafter is formed by, for example, dual damascene. However, illustration and explanations thereof are omitted herein. The wiring M1 and the wiring in the layers thereabove is not limited to damascene wiring, but can be formed by patterning an electrically-conductive film for wiring, and can be, for example, tungsten wiring or aluminum wiring.

In the above-described manner, the semiconductor device of the present embodiment is manufactured.

<About Main Characteristics and Effects>

The semiconductor device of the present embodiment has the semiconductor substrate SB, the gate insulating film (in this case, the insulating film MZ) for the memory element MC formed on the semiconductor substrate SB, and the gate electrode MG for the memory element MC formed on the gate insulating film. The gate insulating film (in this case, the insulating film MZ) of the memory element MC has the first insulating film (in this case, the aluminum oxide film AOX1), the second insulating film (in this case, the hafnium silicate film HSO) on the first insulating film, and the third insulating film (in this case, the aluminum oxide film AOX2) on the second insulating film. The second insulating film (in this case, the hafnium silicate film HSO) is a high-dielectric constant insulator film having a charge accumulating function (in other words, a trap insulating film formed of a high-dielectric constant film) and contains hafnium, silicon, and oxygen. The band gap of each of the first insulating film (in this case, the aluminum oxide film AOX1) and the third insulating film (in this case, the aluminum oxide film AOX2) is larger than the band gap of the second insulating film (in this case, the hafnium silicate film HSO). When the atomic ratio (the ratio of the numbers of atoms) of hafnium and silicon in the second insulating film (in this case, the hafnium silicate film HSO) is x:y, $0.77 \leq x/(x+y) \leq 0.91$ is satisfied. Note that x and y may be integers or may not be integers.

The semiconductor device of the present embodiment is a semiconductor device having a non-volatile memory. More specifically, the semiconductor device of the present embodiment has the memory element MC, and the gate insulating film (in this case, the insulating film MZ) of the memory element MC includes the insulating film (in this case, the hafnium silicate film HSO) having the charge accumulating function. Information can be stored by accumulating or retaining charge in the insulating film having the charge accumulating function.

One of the main characteristics of the semiconductor device of the present embodiment is that the insulating film (the trap insulating film) having the charge accumulating function in the gate insulating film (in this case, the insulating film MZ) for the memory element MC is a high-dielectric constant insulator film and contains hafnium, silicon, and oxygen.

Since the trap insulating film (in this case, the hafnium silicate film HSO) in the gate insulating film (in this case, the insulating film MZ) for the memory element MC is the high-dielectric constant insulator film containing hafnium, silicon, and oxygen, the physical film thickness of the trap insulating film can be increased (thickened) while suppressing EOT (equivalent oxide thickness) of the trap insulating film (in this case, the hafnium silicate film HSO). The high-dielectric constant insulator film (in this case, the hafnium silicate film HSO) containing hafnium, silicon, and oxygen has a dielectric constant (relative permittivity) higher than those of silicon nitride. It is desired that the trap insulating film in the gate insulating film for the memory element have a thick physical film thickness from a viewpoint of improving charge retaining characteristics.

The charge is discretely trapped (captured) in the trap levels in the trap insulating film, wherein the charge is moved in the trap insulating film while the threshold voltage of the memory element is controlled by injecting electrons or positive holes into the trap insulating film. However, the farther the trapped position in the trap insulating film is from the surfaces (upper surface and lower surface) of the trap insulating film, the more it becomes difficult for the charge trapped in the trap insulating film to be removed from the trap insulating film. More specifically, the thicker the trap insulating film, charge can be trapped at a position more distant from the surfaces of the trap insulating film in the trap insulating film; therefore, it becomes difficult for the charge trapped in the trap insulating film to be removed from the trap insulating film. When it becomes difficult for the charge to be removed from the trap insulating film, the charge retaining characteristics of the memory element (memory cell) are improved. Therefore, it is desired that the physical film thickness of the trap insulating film be thick.

Therefore, in the present embodiment, the trap insulating film (in this case, the hafnium silicate film HSO) in the gate insulating film (in this case, the insulating film MZ) for the memory element MC is a high-dielectric constant insulator film containing hafnium, silicon, and oxygen; therefore, the physical film thickness of the trap insulating film can be increased (thickened) while suppressing EOT of the trap insulating film. By virtue of this, the charge retaining characteristics of the memory element can be improved. Therefore, the performance of the semiconductor device can be improved.

Since EOT of the trap insulating film can be suppressed, EOT of the gate insulating film (in this case, the insulating film MZ) for the memory element can be suppressed; therefore, for example, operating voltages (programming voltage or erasing voltage) can be reduced. Moreover, the operating speed of the memory element can be improved. Moreover, power consumption can be reduced. Moreover, since programming time and erasing time of data can be shortened even with a low driving voltage, data processing speeds can be increased. Therefore, the performance of the semiconductor device can be improved.

Moreover, in the present embodiment, it is more preferable that the gate insulating film (in this case, the insulating film MZ) for the memory element MC be a high-dielectric constant gate insulating film. More specifically, the gate insulating film (in this case, the insulating film MZ) of the memory element have the first insulating film (in this case, the aluminum oxide film AOX1), the second insulating film (in this case, the hafnium silicate film HSO) on the first insulating film, and the third insulating film (in this case, the aluminum oxide film AOX2) on the second insulating film; wherein, it is preferable that the first insulating film, the second insulating film, and the third insulating film be high-dielectric constant insulator films. In other words, it is preferable that the gate insulating film (in this case, the insulating film MZ) of the memory element MC have a stacked structure in which the second high-dielectric constant insulator film (in this case, the hafnium silicate film HSO) having the charge accumulating function is sandwiched by the third high-dielectric constant insulator film (in this case, the aluminum oxide film AOX2) and the first high-dielectric constant insulator film (in this case, the aluminum oxide film AOX1). All of the first high-dielectric constant insulator film, the second high-dielectric constant insulator film, and the third high-dielectric constant insulator film are high-dielectric constant insulator films having higher dielectric constants than those of silicon oxides.

A case in which, instead of employing high-dielectric constant gate insulating films as the gate insulating film for the memory element, a stacked film of a silicon oxide film, a silicon nitride film, and a silicon oxide film (in other words, an ONO film) is used as the gate insulating film for the memory element different from the present embodiment is assumed as a comparative example. Herein, the stacked film in which a silicon oxide film, a silicon nitride film, and a silicon oxide film are sequentially stacked will be referred to as an ONO (Oxide-Nitride-Oxide) film. The ONO film can be also considered as a stacked film in which a silicon nitride film is sandwiched by silicon oxide films.

When an ONO film is employed as the gate insulating film for the memory element, the dielectric constant thereof is comparatively low; therefore, EOT (Equivalent Oxide Thickness: oxide-film-converted film thickness) of the gate insulating film is increased. Therefore, there is a concern that the operating voltage may be increased since EOT of the gate insulating film is increased. Moreover, when the physical film thickness is to be reduced in order to reduce EOT of the gate insulating film, there is a concern that retaining characteristics (retention characteristics) may be deteriorated due to leak. These reduce the performance of the semiconductor device.

In the present embodiment, the high-dielectric constant gate insulating films are employed as the gate insulating film (in this case, the insulating film MZ) for the memory element MC; therefore, compared with the case in which the high-dielectric constant gate insulating films are not employed (in other words, the case in which the ONO film is employed), EOT of the gate insulating film can be reduced by the amount of the high dielectric constants. By virtue of this, the physical film thickness can be increased while suppressing EOT of the films of the gate insulating film (in this case, the insulating film MZ) for the memory element MC; therefore, deterioration of the retaining characteristics (retention characteristics) due to leak can be prevented, and the retaining characteristics can be improved. Moreover, since EOT can be reduced while ensuring the physical film thicknesses of the films of the gate insulating film (in this case, the insulating film MZ) for the memory element MC, for example, the operating voltages (programming voltage or erasing voltage) can be reduced while preventing deterioration of the retaining characteristics (retention characteristics) due to leak. Moreover, the operating speed of the memory element can be improved. Moreover, power consumption can be reduced. Moreover, since the programming time and erasing time of data can be reduced even at low driving voltages, the data processing speed can be increased. Therefore, the performance of the semiconductor device can be improved.

As described above, each of the third insulating film and the first insulating film positioned above/below the second insulating film (in this case, the hafnium silicate film HSO), which is a trap insulating film, has to have a larger band gap than the band gap of the second insulating film, which is the trap insulating film, so as to be able to function as a charge block layer (or a charge confinement layer) for confining charge in the trap insulating film. From this viewpoint, as the first insulating film and the third insulating film which function as the charge block layers (or charge confinement layers), aluminum oxide films, silicon oxide films, silicon oxynitride films (SiON films), aluminum oxynitride films (AlON films), aluminum silicate films (AlSiO films), or hafnium aluminate films (HfAlO films) can be suitably used.

As described above, it is preferable that the first insulating film and the third insulating film which function as the charge block layers (or charge confinement layers) also have high dielectric constants. By virtue of this, the physical film thicknesses of the first insulating film and the third insulating film can be increased while suppressing EOT of the first insulating film and the third insulating film which function as the charge block layers (or charge confinement layers); therefore, as described above, deterioration of the retaining characteristics (retention characteristics) due to leak can be prevented, and the retaining characteristics can be improved. Moreover, since EOT can be reduced while ensuring the physical film thicknesses of the first insulating film and the third insulating film, as described above, for example, reduction of the operating voltage of the memory element and improvement of the operating speed can be achieved. From this viewpoint, it is more preferable that, as the first insulating film and the third insulating film which function as the charge block layers (or the charge confinement layers), aluminum oxide films, aluminum oxynitride films (AlON films), aluminum silicate films (AlSiO films), or hafnium aluminate films (HfAlO films) be used, and, by virtue of that, the dielectric constants of the first insulating film and the third insulating film can be precisely increased. All of the aluminum oxide films, the aluminum oxynitride films (AlON films), aluminum silicate films (AlSiO films), and the hafnium aluminate films (HfAlO films) are high-dielectric constant insulator films, have higher dielectric constants (relative permittivities) than those of silicon oxides, and have high dielectric constants even when compared with silicon nitrides.

Furthermore, as the first insulating film and the third insulating film which function as charge block layers (or charge confinement layers), aluminum oxide films are the most preferable. More specifically, the aluminum oxide film AOX1 is the most preferable as the first insulating film, and the aluminum oxide film AOX2 is the most preferable as the third insulating film. When the aluminum oxide film AOX1 and the aluminum oxide film AOX2 are used as the first insulating film and the third insulating film which function as the charge block layers (or charge confinement layers), the first insulating film and the third insulating film can more precisely function as the charge block layers (or charge confinement layers), and the dielectric constants of the first insulating film and the third insulating film can be more precisely increased. More specifically, when the high-dielectric constant insulator film containing hafnium, silicon, and oxygen (preferably, the hafnium silicate film) is used as the second insulating film having the charge accumulating function, from the viewpoint as the function as the charge block layer (or the charge confinement layer) and from the viewpoint of increasing the dielectric constant, it is most preferable that aluminum oxide films be used as the first insulating film and the third insulating film, respectively.

Another one of the main characteristics of the semiconductor device of the present embodiment is that, when the second insulating film (in this case, the hafnium silicate film HSO) having the charge accumulating function contains hafnium, silicon, and oxygen, wherein the atomic ratio of hafnium and silicon in the second insulating film x:y, $0.77 \leq x/(x+y) \leq 0.91$ is satisfied. Note that x and y may be integers or may not be integers.

A Hf-based insulating film which is an insulating film containing Hf is suitable as the high-dielectric constant insulator film having the charge accumulating function. Therefore, the stacked film in which the aluminum oxide film, the hafnium oxide film, and the aluminum oxide film are sequentially stacked (in other words, AHA film) is used as the gate insulating film for the memory element, and the hafnium oxide film can function as the insulating film having the charge accumulating function, in other words, the trap insulating film. However, it is preferable that the trapped charge density (area density of the charge which can be trapped) in the trap insulating film be as large as possible. Herein, the stacked film in which the aluminum oxide film, the hafnium oxide film, and the aluminum oxide film are sequentially stacked is referred to as an AHA (Aluminum oxide-Hafnium oxide-Aluminum oxide) film. The AHA film can be considered as a stacked film in which the hafnium oxide film is sandwiched by the aluminum oxide films.

According to the study of the present inventor, below facts have been found out. About a case in which the ONO film was employed as the gate insulating film for the memory element, the trapped charge density in the trap insulating film (in this case, the silicon nitride film in the ONO film) was evaluated, and about $2.1 \times 10^{-6}$ C/cm$^2$ was obtained. On the other hand, about a case in which the AHA film having a physical film thickness equivalent to that of the ONO film was employed as the gate insulating film for the memory element, the trapped charge density in the trap insulating film (in this case, the hafnium oxide film in the AHA film) was evaluated, and about $3.2 \times 10^{-6}$ C/cm$^2$ was obtained. Therefore, when the AHA film is employed as the gate insulating film for the memory element, the trapping charge density can be increased to about 1.5 times compared with the case in which the ONO film is employed. However, the trapped charge density in the trap insulating film is preferable to be as large as possible.

When the AHA film having the physical film thickness equivalent to that of the ONO film was employed as the gate insulating film for the memory element, EOT of the AHA film is reduced (for example, becomes about half) compared with EOT of the ONO film. Therefore, in the case in which a high-dielectric constant gate insulating film such as the AHA film is employed as the gate insulating film for the memory element, when the accumulated charge amount in the gate insulating film is the same compared with the case in which the ONO film is employed, the difference between the threshold voltages in programming and in erasing of the memory element becomes small. In order to improve the performance of the semiconductor device having the memory element, it is preferable that the difference between the threshold voltages in programming and in erasing of the memory element be large so that the information stored in the memory element can be accurately and easily read. In order to increase the difference between the threshold voltages in programming and in erasing of the memory element, it is effective to increase the trapped charge density in the trap insulating film in the gate insulating film for the memory element and increase the charge amount accumulated in the gate insulating film in programming. Therefore, in the case in which the high-dielectric constant gate insulating film such as the AHA film is employed as the gate insulating film for the memory element, it is important to increase the trapped charge density in the trap insulating film as much as possible for improving the performance of the semiconductor device having the memory element. For example, in the case in which the high-dielectric constant gate insulating film such as the AHA film is employed as the gate insulating film for the memory element, in order to cause the difference between the threshold voltages in programming and in erasing of the memory element to be equivalent to that of the case in which the ONO film is employed as the gate insulating film, it is desired that the trapped charge density of the high-dielectric constant gate insulating film be about 2 times or more of the trapped charge density of the ONO film.

Therefore, in the present embodiment, the Hf-based insulating film containing Hf (hafnium) is used as the trap insulating film (in this case, the hafnium silicate film HSO) in the gate insulating film of the memory element MC, and the Hf-based insulating film contains a predetermined concentration of Si (silicon). More specifically, the second insulating film (in this case, the hafnium silicate film HSO) which is the trap insulating film in the gate insulating film of the memory element MC contains hafnium (Hf), silicon (Si), and oxygen (O). When the atomic ratio of hafnium (Hf) and silicon (Si) in the second insulating film (in this case, the hafnium silicate film HSO) is x:y, $0.77 \leq x/(x+y) \leq 0.91$ is satisfied. Note that x and y may be integers or may not be integers. By virtue of this, as explained below with reference to FIG. 17, etc., the trapped charge density of the second insulating film (in this case, the hafnium silicate film HSO) which is the trap insulating film can be increased.

Figure 17:
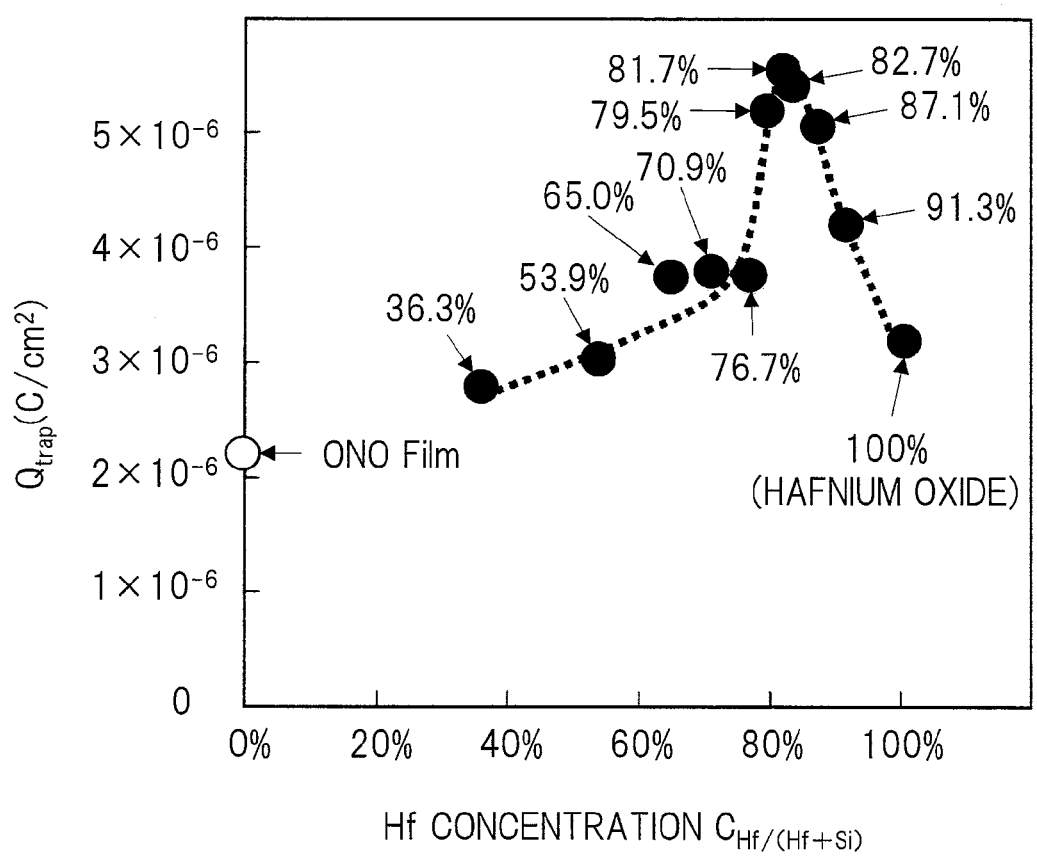
FIG. 17 is a graph showing the correlation between the Hf concentrations and trapped charge densities in hafnium silicate films.

FIG. 17 is a graph showing the correlation between the Hf (hafnium) concentration $C_{Hf/(Hf+Si)}$ in the hafnium silicate film and the trapped charge density $Q_{trap}$ in the hafnium silicate film in the case in which a stacked film in which an aluminum oxide film, a hafnium silicate film, and an aluminum oxide film are sequentially stacked is employed as the gate insulating film of the memory element. The horizontal axis of the graph of FIG. 17 corresponds to the Hf concentration $C_{Hf/(Hf+Si)}$ in the hafnium silicate film, and the vertical axis of the graph of FIG. 17 corresponds to the trapped charge density $Q_{trap}$ in the hafnium silicate film. The unit of the Hf concentration $C_{Hf/(Hf+Si)}$ is expressed by % and this means atomic %.

Herein, the trapped charge density $Q_{trap}$ corresponds to the area density of the charge which can be trapped, for example, in the case of $Q_{trap}=3\times10^{-6}$ C/cm², it means that the charge of 3×10-6 C (coulomb) can be trapped (captured) per 1 cm2. In FIG. 17, the trapped charge density $Q_{trap}$ is checked in each of the cases in which the Hf concentration $C_{Hf/(Hf+Si)}$ in the hafnium silicate film is 36.3%, 53.9%, 65.0%, 70.9%, 76.7%, 79.5%, 81.7%, 82.7%, 87.1%, 91.3%, and 100%, and the results thereof are plotted by black circles (●). In the graph of FIG. 17, the numerical values displayed with % denoted for the black circles (●) correspond to the Hf concentration $C_{Hf/(Hf+Si)}$ at the black circle (●).

The Hf concentration can be measured by using, for example, energy dispersive X-ray spectrometry (EDX: Energy dispersive X-ray spectrometry).

The horizontal axis of FIG. 17 corresponds to the Hf concentration $C_{Hf/(Hf+Si)}$, wherein the Hf concentration $C_{Hf/(Hf+Si)}$ is the value showing, by atomic %, the ratio of the number of the atoms of Hf (hafnium) to the total number of the atoms of Hf (hafnium) and Si (silicon) in the hafnium silicate film. More specifically, the Hf concentration $C_{Hf/(Hf+Si)}$ is the value showing, by % display (atomic %), the value obtained by dividing the number of the atoms of Hf (hafnium) by the sum of the number of the atoms of Hf (hafnium) and the number of atoms of Si (silicon) in the hafnium silicate film. In other words, when the composition (composition ratio) of the hafnium silicate film is described as $Hf_xSi_yO_z$, the value of $x/(x+y)$ expressed by %-display is the Hf concentration $C_{Hf/(Hf+Si)}$. Therefore, the case of $C_{Hf/(Hf+Si)}=79.5\%$ correspond to $x/(x+y)=0.795$ when the composition (composition ratio) of the hafnium silicate film is described as $Hf_xSi_yO_z$.

The case in which the Hf concentration $C_{Hf/(Hf+Si)}$ is 100% corresponds to the case in which y in $Hf_xSi_yO_z$ is zero, in other words, to the case Si (silicon) is not contained; therefore, the trap insulating film is a hafnium oxide instead of a hafnium silicate film. Thus, $C_{Hf/(Hf+Si)}=100\%$ corresponds to a hafnium oxide not containing Si (silicon).

In the graph of FIG. 17, as reference, the trapped charge density $Q_{trap}$ of the silicon nitride film in the ONO film of the case in which the ONO film is employed as the gate insulating film of the memory element is shown by a white circle (O), and the white circle (O) is denoted with "ONO film".

As is understood also from the graph of FIG. 17, in order to increase the trapped charge density $Q_{trap}$ in the hafnium silicate film, it is extremely effective to set the Hf concentration $C_{Hf/(Hf+Si)}$ in the hafnium silicate film in the range of 77 to 91 atomic % (in other words, 77 atomic % $\leq C_{Hf/(Hf+Si)} \leq$ 91 atomic %).

More specifically, as shown in the graph of FIG. 17, when the Hf concentration $C_{Hf/(Hf+Si)}$ is smaller than 77 atomic %, the dependency of the trapped charge density $Q_{trap}$ on the Hf concentration $C_{Hf/(Hf+Si)}$ is not so large, and the trapped charge density $Q_{trap}$ is comparatively gently increased along with increase of the Hf concentration $C_{Hf/(Hf+Si)}$. However, when the Hf concentration $C_{Hf/(Hf+Si)}$ is higher than or equal to 77 atomic %, the trapped charge density $Q_{trap}$ is rapidly increased, and the trapped charge density $Q_{trap}$ exhibits a peak value (maximum value) when the Hf concentration $C_{Hf/(Hf+Si)}$ is about 82 atomic %. The trapped charge density $Q_{trap}$ at the peak value is $5.5\times10^{-6}$ C/cm², wherein the trapped charge density $Q_{trap}$ is largely increased compared with the trapped charge density $Q_{trap}$ of $3.2\times10^{-6}$ C/cm² of the case in which the Hf concentration $C_{Hf/(Hf+Si)}$ is 100 atomic % (in other words, the case of the hafnium oxide film instead of the hafnium silicate film). Moreover, the trapped charge density $Q_{trap}$ at the peak value is sufficiently large and is 2 times or more even when compared with $2.1\times10^{-6}$ C/cm² which is the trapped charge density $Q_{trap}$ of the case in which the ONO film is employed.

When the Hf concentration $C_{Hf/(Hf+Si)}$ is further increased after the trapped charge density $Q_{trap}$ exhibits the peak value (maximum value) when the Hf concentration $C_{Hf/(Hf+Si)}$ is about 82 atomic %, the trapped charge density $Q_{trap}$ is reduced. When the Hf concentration $C_{Hf/(Hf+Si)}$ becomes larger than 91 atomic %, the trapped charge density $Q_{trap}$ becomes a low value and is not so different from the value of the trapped charge density $Q_{trap}$ of the case in which the Hf concentration $C_{Hf/(Hf+Si)}$ is less than 77 atomic %. More specifically, as shown in the graph of FIG. 17, the value of the trapped charge density $Q_{trap}$ is specifically increased in the range of 77 to 91 atomic % compared with the other ranges. In other words, as shown in the graph of FIG. 17, the trapped charge density $Q_{trap}$ is specifically increased in the range in which the Hf concentration $C_{Hf/(Hf+Si)}$ is in the range of 77 to 91 atomic %, and the trapped charge density $Q_{trap}$ is the highest in the range of 79 to 87 atomic %.

Therefore, in order to improve the trapped charge density $Q_{trap}$, it is extremely effective that the Hf concentration $C_{Hf/(Hf+Si)}$ in the hafnium silicate film (HSO) is within the range of 77 to 91 atomic % (in other words, 77 atomic % ≤ $C_{Hf/(Hf+Si)}$ ≤ 91 atomic %), and it is the most effective that the Hf concentration is particularly 79 to 87 atomic % (in other words, 79 atomic % ≤ $C_{Hf/(Hf+Si)}$ ≤ 87 atomic %) within the range.

Therefore, in the present embodiment, the insulating film containing hafnium (Hf), silicon (Si), and oxygen (O) is used as the trap insulating film (in this case, the hafnium silicate film HSO) in the gate insulating film of the memory element MC, and the Hf concentration $C_{HF/(Hf+Si)}$ in the insulating film is within the range of 77 to 91 atomic %. This has the same meaning as a case in which 0.77 ≤ x/(x+y) ≤ 0.91 is satisfied when the atomic ratio of Hf (hafnium) and Si (silicon) is x:y. Note that x and y may be integers or may not be integers. When it is further preferable that the Hf concentration $C_{Hf/(Hf+Si)}$ be within the range of 79 to 87 atomic %, and this corresponds to a case in which 0.79 ≤ x/(x+y) ≤ 0.87 is satisfied when the atomic ratio of Hf (hafnium) and Si (silicon) is x:y in the trap insulating film (in this case, the hafnium silicate film HSO) containing hafnium (Hf), silicon (Si), and oxygen (O).

By virtue of this, the trapped charge density ($Q_{trap}$) can be increased for the trap insulating film (in this case, the hafnium silicate film HSO) in the gate insulating film of the memory element MC, and, as a result, the performance of the semiconductor device having the memory element can be improved. For example, since the charge amount which can be accumulated in the gate insulating film of the memory element can be increased, the difference between the threshold voltages in programming and in erasing of the memory element can be increased. Therefore, the information stored in the memory element can be more accurately and easily read. When the trapped charge density ($Q_{trap}$), which is an area density, is increased, even when the dimensions of the memory element are reduced, the charge amount accumulated in the gate insulating film of the memory element can be ensured. Therefore, this is advantageous also for downsizing of the semiconductor device.

When the high-dielectric constant gate insulating film is employed as the gate insulating film for the memory element, the difference between the threshold voltages in programming and erasing of the memory element easily becomes small. On the other hand, in the present embodiment, since the trapped charge density ($Q_{trap}$) of the trap insulating film (in this case, the hafnium silicate film HSO) in the gate insulating film of the memory element can be increased in the above-described manner, even when the high-dielectric constant gate insulating film is employed as the gate insulating film for the memory element, the difference between the threshold voltages in programming and in erasing of the memory element can be sufficiently ensured. Therefore, while enjoying the effect of using the high-dielectric constant gate insulating film as the gate insulating film for the memory element, the effect of increasing the trapped charge density of the trap insulating film in the high-dielectric constant gate insulating film can be also obtained.

Figure 18:
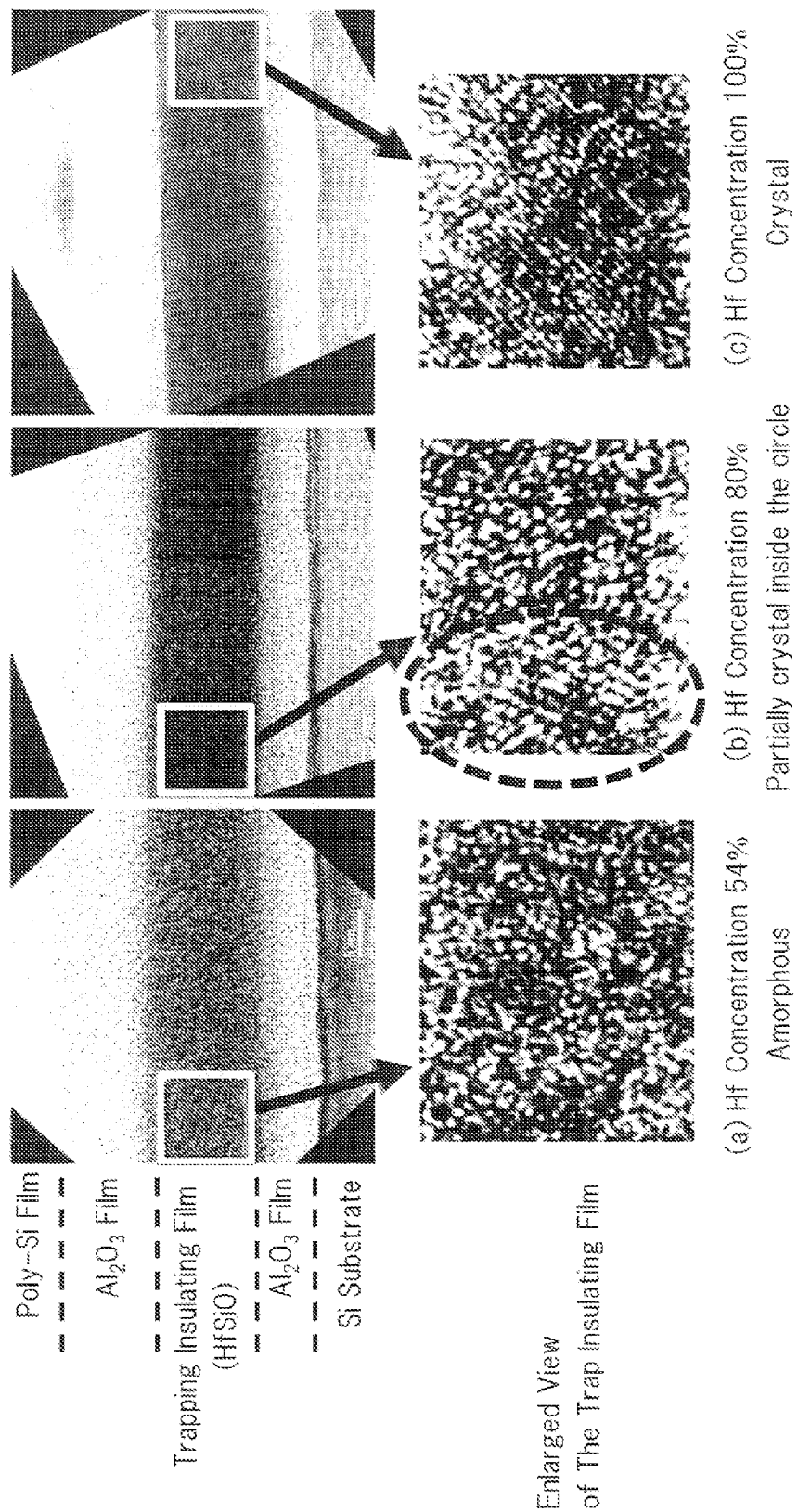
FIG. 18 is an explanatory diagram showing cross-sectional TEM photographs of the cases in which a gate insulating film formed of a stacked film of an aluminum oxide film, a hafnium silicate film, and an aluminum oxide film stacked on an Si substrate is formed, and a polysilicon gate electrode is formed on the gate insulating film.

FIG. 18 is an explanatory diagram showing cross-sectional TEM photographs of the cases in which a gate insulating film formed of a stacked film of an aluminum oxide film, a hafnium silicate film, and an aluminum oxide film stacked sequentially from the lower side on an Si substrate (a semiconductor substrate formed of single-crystal silicon), and a polysilicon gate electrode is formed on the gate insulating film. Herein, the polysilicon gate electrode is a gate electrode formed of polysilicon. Also, TEM (Transmission Electron Microscope) means a transmission-type electron microscope.

FIG. 18(a) corresponds to the case in which the Hf concentration $C_{Hf/(Hf+Si)}$ in the hafnium silicate film, which is the trap insulating film, is 54 atomic %, and FIG. 18(b) corresponds to the case in which the Hf concentration $C_{Hf/(Hf+Si)}$ in the hafnium silicate film, which is the trap insulating film, is 80 atomic %. FIG. 18(c) corresponds to the case in which the Hf concentration $C_{Hf/(Hf+Si)}$ in the hafnium silicate film is 100 atomic %, in other words, the case in which the trap insulating film is not a hafnium silicate film, but is a hafnium oxide film.

In each of FIGS. 18(a), (b), and (c), the TEM photograph in the upper side is a TEM photograph showing a cross section of the stacked structure of the Si substrate, the aluminum oxide film ($Al_2O_3$ film) in the lower layer side, the trap insulating film, the aluminum oxide film ($Al_2O_3$ film) in the upper layer side, and the polysilicon gate electrode (poly Si film). In each of (a), (b), and (c) of FIG. 18, the TEM photograph in the lower side is a TEM photograph showing part of the cross section of the trap insulating film in an enlarged manner. Herein, in the case of (a) and the case of (b) of FIG. 18, the trap insulating film corresponds to the hafnium silicate film. In the case of (c) of FIG. 18, the trap insulating film corresponds to the hafnium oxide film.

In the case of FIG. 18(a), the trap insulating film is the hafnium silicate film having the Hf concentration $C_{Hf/(Hf+Si)}$ of 54 atomic %, and this trap insulating film was in an amorphous state. On the other hand, in the case of FIG. 18(b), the trap insulating film is the hafnium silicate film having the Hf concentration $C_{Hf/(Hf+Si)}$ of 80 atomic %, and part of the trap insulating film (the part surrounded by a dotted-line ellipse in the TEM photograph in the lower side of FIG. 18(b)) was crystallized. In the case of FIG. 18(c), the trap insulating film is the hafnium oxide, and the entire trap insulating film was crystallized.

Figure 19:
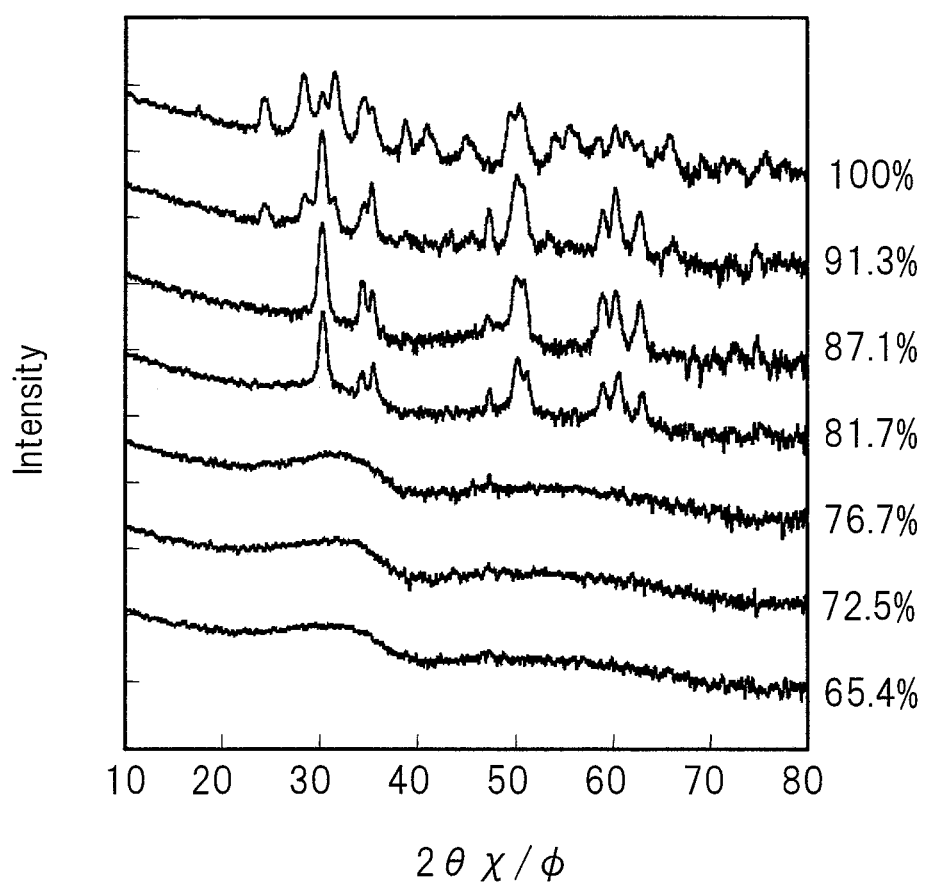
FIG. 19 is an explanatory diagram showing results of X-ray diffraction.

FIG. 19 is an explanatory diagram showing results of X-ray diffraction of the cases in which the Hf concentration $C_{Hf/(Hf+Si)}$ in the hafnium silicate film, which is the trap insulating film, is changed. The horizontal axis of FIG. 19 corresponds to the incident angles of X-rays in the X-ray diffraction, and the vertical axis of FIG. 19 corresponds to diffraction intensity. FIG. 19 illustrates the results of the X-ray diffraction in the case in which the Hf concentration $C_{Hf/(Hf+Si)}$ in the hafnium silicate film is 65.4%, the case in which the Hf concentration is 72.5%, the case in which the Hf concentration is 76.7%, the case in which the Hf concentration is 81.7%, the case in which the Hf concentration is 87.1%, the case in which the Hf concentration is 91.3%, and the case in which the Hf concentration is 100%; wherein in order to facilitate viewing of the drawing, the diffraction patterns thereof are shifted in the direction of the vertical axis so that the patterns are not overlapped with each other. In FIG. 19, the numerical values described with % denoted in the side of the diffraction patterns are the values of the Hf concentrations $C_{Hf/(Hf+Si)}$ of the films for which the diffraction patterns were checked. The unit of the Hf concentration $C_{Hf/(Hf+Si)}$ is expressed by %, and this means atomic %. The case in which the Hf concentration $C_{Hf/(Hf+Si)}$ is 100% corresponds to the case in which Si is not contained; therefore, the trap insulating film is not a hafnium silicate film, but is a hafnium oxide.

As is understood from FIG. 19, in the case in which the Hf concentration $C_{Hf/(Hf+Si)}$ is 65.4%, the case in which the Hf concentration is 72.5%, the case in which the Hf concentration is 76.7%, peaks of the X-ray diffraction are not observed, and it illustrates that the hafnium silicate film is in an amorphous state. On the other hand, in the case in which the Hf concentration $C_{Hf/(Hf+Si)}$ is 81.7%, the case in which the Hf concentration is 87.1%, the case in which the Hf concentration is 91.3%, and the case in which the Hf concentration is 100%, peaks of the X-ray diffraction were observed, and it illustrates that the hafnium silicate film (however, when the Hf concentration $C_{Hf/(Hf+Si)}$ is 100%, the hafnium oxide film) is crystallized.

In the case in which the Hf concentration $C_{Hf/(Hf+Si)}$ is 81.7% and the case in which the Hf concentration is 87.1%, the peak positions of the X-ray diffraction patterns are almost the same. Therefore, in the case in which the Hf concentration $C_{Hf/(Hf+Si)}$ is 81.7% and in the case in which the Hf concentration is 87.1%, it is conceived that the crystal structures (crystal phases) of the hafnium silicate film are approximately the same, and it is conceived that the structures as approximately the same as the crystal structure of $HfO_2$ of orthorhombic crystals (orthorhombic) as described later.

However, in the case in which the Hf concentration $C_{Hf/(Hf+Si)}$ is 100%, in other words, in the case of the hafnium oxide film; the peak positions of the X-ray diffraction patterns are different from those of the case in which the Hf concentration $C_{Hf/(Hf+Si)}$ is 81.7% and the case in which the Hf concentration is 87.1%. Therefore, the crystal structure (crystal phase) of the case in which the Hf concentration $C_{Hf/(Hf+Si)}$ is 100% is conceived to be different from the crystal structures (crystal phases) of the case in which the Hf concentration $C_{Hf/(Hf+Si)}$ is 81.7% and the case in which the Hf concentration is 87.1% and is conceived to be approximately the same as the crystal structure of $HfO_2$ of a monoclinic crystal as described later.

The diffraction pattern of the case in which the Hf concentration $C_{Hf/(Hf+Si)}$ is 91.3% is a diffraction pattern in which as when the diffraction patterns of the case in which the Hf concentration $C_{Hf/(Hf+Si)}$ is 81.7% and the case in which the Hf concentration is 87.1% (more specifically, the diffraction patterns of the orthorhombic crystals) are mixed with the diffraction pattern of the case in which the Hf concentration $C_{Hf/(Hf+Si)}$ is 100% (more specifically, the diffraction pattern of the monoclinic crystal). Therefore, in the case in which the Hf concentration $C_{Hf/(Hf+Si)}$ is 91.3%, the hafnium silicate film is conceived to be a mixture of the crystal phases similar to those of the case in which the Hf concentration $C_{Hf/(Hf+Si)}$ is 81.7% and the case in which the Hf concentration is 87.1% (more specifically, crystal phases of orthorhombic crystals) with the crystal phase of the case in which the Hf concentration $C_{Hf/(Hf+Si)}$ is 100% (more specifically, a crystal phase of a monoclinic crystal).

Figure 20:
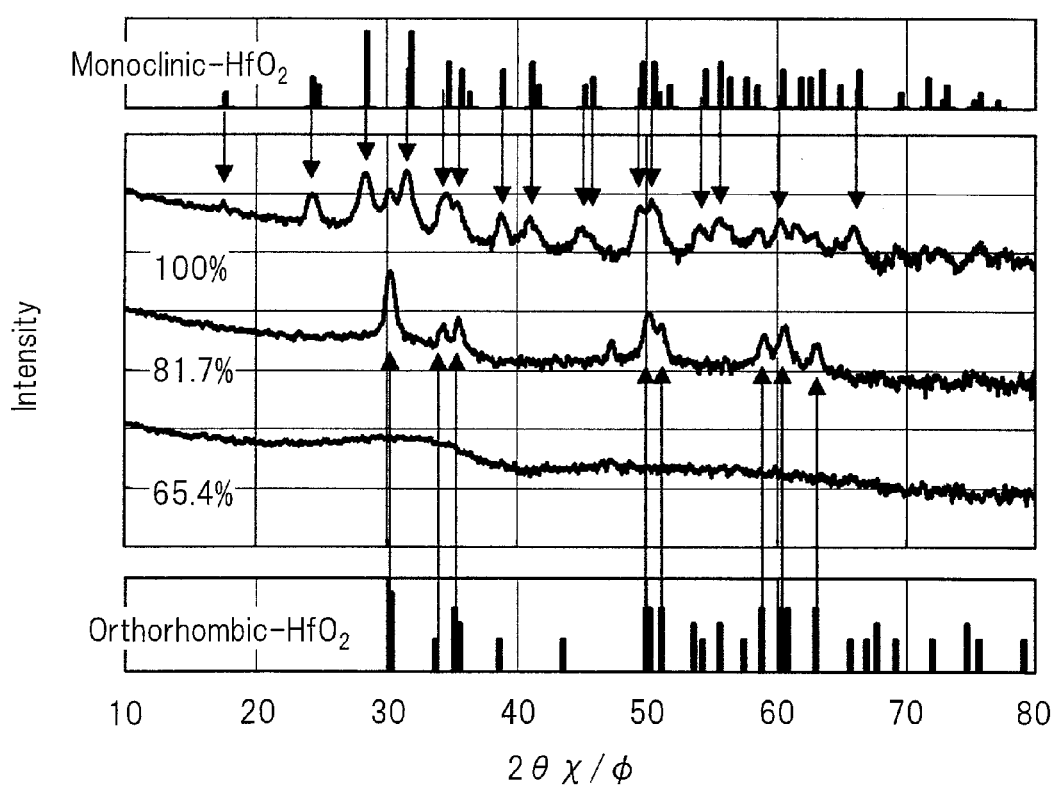
FIG. 20 is an explanatory diagram showing results of the X-ray diffraction.

FIG. 20 is an explanatory diagram showing results of X-ray diffraction of a case in which the Hf concentration $C_{Hf/(Hf+Si)}$ in the hafnium silicate film, which is the trap insulating film, was changed. The horizontal axis of FIG. 20 corresponds to the incident angles of X-rays in the X-ray diffraction, and the vertical axis of FIG. 20 corresponds to diffraction intensity. FIG. 20 extracts and illustrates the three diffraction patterns of the case in which the Hf concentration $C_{Hf/(Hf+Si)}$ is 65.4%, the case in which the Hf concentration is 81.7%, and the case in which the Hf concentration is 100% in FIG. 19, illustrates the diffraction peak positions of the case of $HfO_2$ of orthorhombic crystals (orthorhombic) below the three diffraction patterns, and illustrates the diffraction peak positions of the case of $HfO_2$ of monoclinic crystals above the three diffraction patterns.

As is understood from FIG. 20, in the case in which the Hf concentration $C_{Hf/(Hf+Si)}$ is 65.4%, peaks of the X-ray diffraction are not observed, and it illustrates that the hafnium silicate film is in an amorphous state. On the other hand, in the case in which the Hf concentration $C_{Hf/(Hf+Si)}$ is 81.7%, the diffraction pattern thereof has peaks at the positions corresponding to the diffraction peak positions of $HfO_2$ of orthorhombic crystals (orthorhombic), and it illustrates that the crystal structure of the hafnium silicate film is approximately the same as the crystal structure of $HfO_2$ of orthorhombic crystals (orthorhombic). In the case in which the Hf concentration $C_{Hf/(Hf+Si)}$ is 100%, in other words, the case of the hafnium oxide film, the diffraction pattern has peaks at the positions corresponding to the diffraction peak positions of $HfO_2$ of monoclinic crystals, and it illustrates that the crystal structure of the hafnium oxide film is approximately the same as the crystal structure of $HfO_2$ of monoclinic crystals.

When these FIG. 18, FIG. 19, and FIG. 20 are taken in consideration in combination, in the case in which the Hf concentration $C_{Hf/(Hf+Si)}$ is within the range of 77 to 91%, it is conceived that hafnium oxide crystals of monoclinic crystals are not generated almost at all and that hafnium oxide crystals of orthorhombic crystals (orthorhombic) are generated. On the other hand, in the case in which the Hf concentration $C_{Hf/(Hf+Si)}$ is less than 77%, the hafnium silicate film becomes the amorphous state. When the Hf concentration $C_{Hf/(Hf+Si)}$ is larger than 91%, it is conceived that hafnium oxide crystals of monoclinic crystals are generated. Therefore, the range of the Hf concentration $C_{Hf/(Hf+Si)}$ in which the trapped charge density $Q_{trap}$ is high and the range of the Hf concentration $C_{Hf/(Hf+Si)}$ in which the hafnium oxide crystals of orthorhombic crystals (orthorhombic) are generated approximately match with each other, and both of them are the range in which 77% $C_{Hf/(Hf+Si)} \leq 91\%$. Therefore, in the case in which the Hf concentration $C_{Hf/(Hf+Si)}$ is within the range of 77 to 91%, hafnium oxide crystals of orthorhombic crystals (orthorhombic) are generated, and it is expected that this contributes to increase of the trapping charge density $Q_{trap}$.

In this manner, in the present embodiment, the trap insulating film in the gate insulating film of the memory element contains hafnium (Hf), silicon (Si), and oxygen (O), and $0.77 \leq x/(x+y) \leq 0.91$ is satisfied when the atomic ratio of hafnium (Hf) and silicon (Si) in the trap insulating film is x:y; as a result, the trapped charge density of the trap insulating film can be increased. By virtue of this, the performance of the semiconductor device having the memory element can be improved.

Moreover, since the trapped charge density $Q_{trap}$ of the hafnium silicate film HSO is increased by crystallizing the hafnium silicate film HSO, it is preferable that the crystal growth of the hafnium silicate film HSO be facilitated by increasing the thermal-treatment temperature of thermal treatment of above-described step S5. From this viewpoint, the thermal-treatment temperature of the thermal treatment of above-described step S5 is preferable to be 800° C. or more, and, by virtue of this, the trapped charge density of the hafnium silicate film HSO can be more precisely increased. On the other hand, the effect of improving the trapped charge density can be increased when the thermal-treatment temperature of the thermal treatment of above-described step S5; however, there is a concern that, when the thermal-treatment temperature is too high, the characteristics of the interface between the semiconductor substrate SB and the gate insulating film may be deteriorated. From this viewpoint, the thermal-treatment temperature of the thermal treatment of above-described step S5 is further preferable to be equal to or less than 1050° C., and, by virtue of this, the characteristics of the interface between the semiconductor substrate SB and the gate insulating film can be precisely prevented from being deteriorated. Therefore, it is more preferable that the thermal-treatment temperature of the thermal treatment of above-described step S5 be set within the range of 800 to 1050° C.

Second Embodiment

In the above-described first embodiment, the case of application to the memory element of a single gate type has been explained. In the present second embodiment, a case of application to a memory element of a split gate type will be explained.

Figure 21:
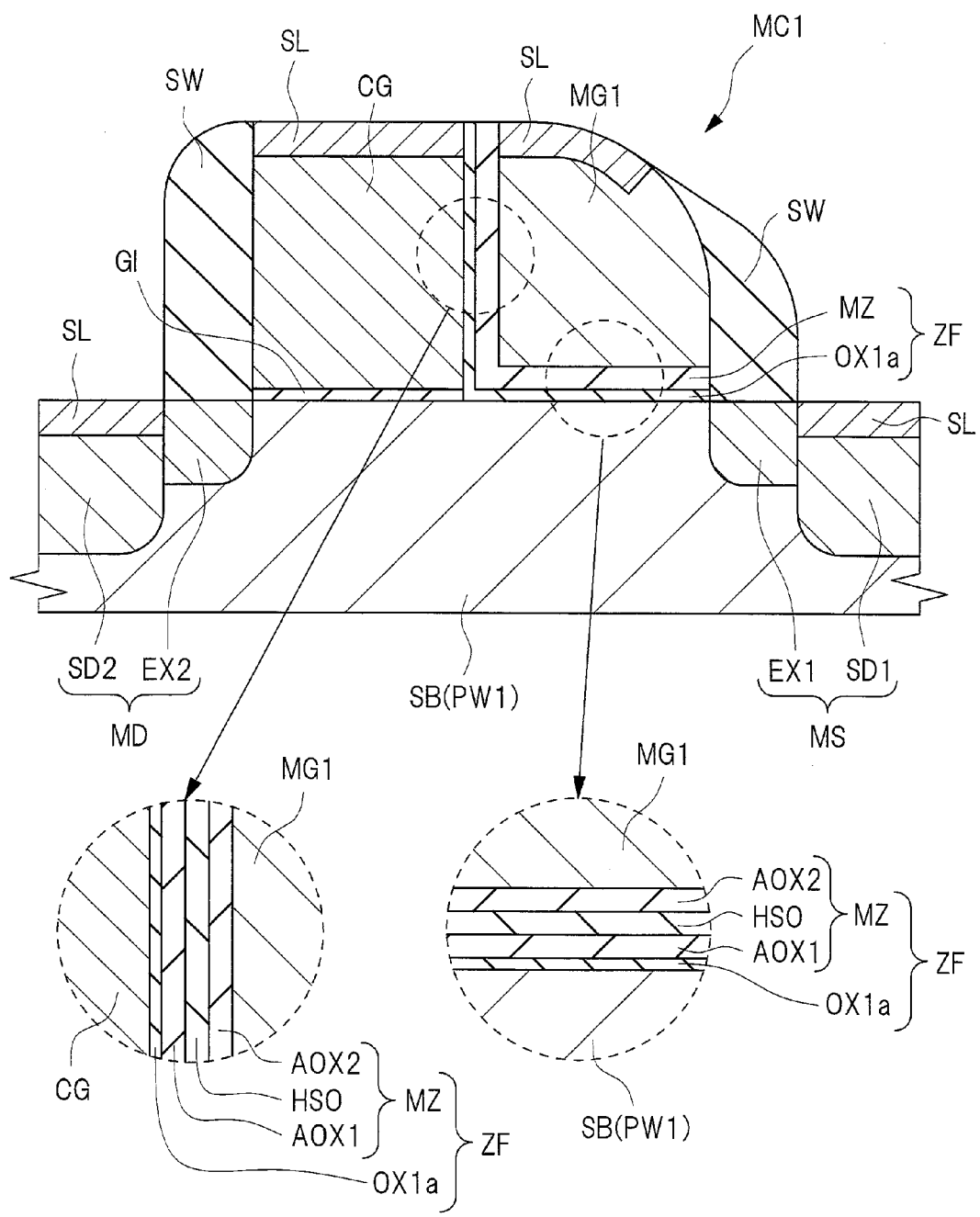
FIG. 21 is a cross-sectional view of main parts of a semiconductor device of another embodiment.
Figures 22, 23:
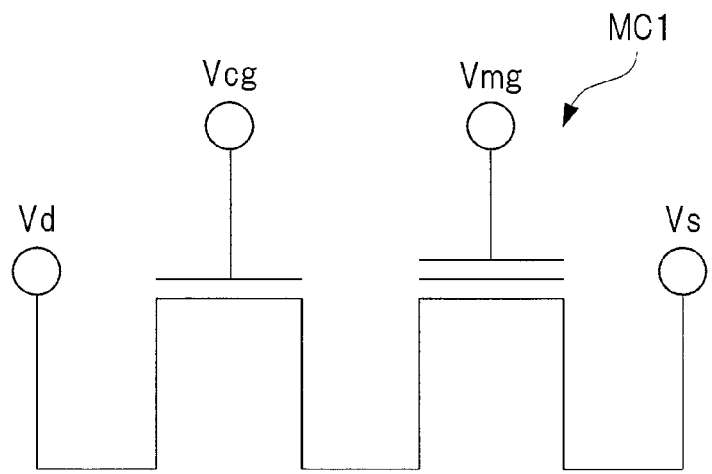
FIG. 22 is an equivalent circuit diagram of a memory cell.
FIG. 23 is a table showing an example of conditions of application of voltages to parts of a selective memory cell in "program", "erase", and "read"

FIG. 21 is a cross-sectional view of main parts of a semiconductor device of the present second embodiment and illustrates a cross-sectional view of main parts of a memory cell region of a non-volatile memory. FIG. 22 is an equivalent circuit diagram of a memory element MC1. In FIG. 21, illustration of insulating films IL1 and IL2, contact holes CT, plugs PT, and wiring M1 is omitted.

As shown in FIG. 21, on a semiconductor substrate SB, the memory element (memory cell) MC1 of the non-volatile memory formed of a memory transistor and a control resistor is formed. In practice, a plurality of memory elements MC1 are formed in an array on the semiconductor substrate SB.

As shown in FIG. 21 and FIG. 22, the memory element (memory cell) MC1 of the non-volatile memory in the semiconductor device of the present second embodiment is a memory element (memory cell) of a split gate type and is two connected MISFETs, i.e., the control transistor having a control gate electrode CG and the memory transistor having a memory gate electrode MG1.

Herein, the MISFET provided with a gate insulating film, which includes a charge accumulating part (charge accumulating layer), and the memory gate electrode MG1 is referred to as a memory transistor, and the MISFET provided with the gate insulating film and the control gate CG is referred to as a control transistor. The control transistor can be also considered as a selective transistor since it is a transistor for selecting the memory cell. The memory transistor is a transistor for storage.

The configuration of the memory element MC1 will be explained below in detail.

As shown in FIG. 21, the memory element MC1 of the non-volatile memory has n-type semiconductor regions MS and MD for a source and a drain formed in a p-type well PW1 of the semiconductor substrate SB, the control gate electrode CG formed above the semiconductor substrate SB (p-type well PW1), and the memory gate electrode MG1 formed above the semiconductor substrate SB (p-type well PW1) and adjacent to the control gate electrode CG. The memory element MC1 of the non-volatile memory further has an insulating film (gate insulating film) GI, which is formed between the control gate electrode CG and the semiconductor substrate SB (p-type well PW1), and an insulating film ZF, which is formed between the memory gate electrode MG1 and the control gate electrode CG.

The control gate electrode CG and the memory gate electrode MG1 are disposed to be extended and arranged next to each other along the main surface of the semiconductor substrate SB in a state in which the insulating film ZF is interposed between the opposing side surfaces thereof. The control gate electrode CG and the memory gate electrode MG1 are formed above the semiconductor substrate SB (p-type well PW1) between the semiconductor region MD and the semiconductor region MS via the insulating film GI or the insulating film ZF, the memory gate electrode MG1 is positioned in the semiconductor region MS side, and the control gate electrode CG is positioned in the semiconductor region MD side. However, on the semiconductor substrate SB, the control gate electrode CG is formed via the insulating film GI, and the memory gate electrode MG1 is formed via the insulating film ZF.

The control gate electrode CG and the memory gate electrode MG1 are adjacent to each other with the insulating film ZF interposed therebetween. The insulating film ZF is extended across both regions of the region between the memory gate electrode MG1 and the semiconductor substrate SB (p-type well PW1) and the region between the memory gate electrode MG1 and the control gate electrode CG.

The insulating film GI formed between the control gate electrode CG and the semiconductor substrate SB (p-type well PW1), in other words, the insulating film GI below the control gate electrode CG functions as a gate insulating film of the control transistor. The insulating film GI can be formed of, for example, a silicon oxide film or a silicon oxynitride film.

The insulating film ZF between the memory gate electrode MG1 and the semiconductor substrate SB (p-type well PW1), in other words, the insulating film ZF below the memory gate electrode MG1 functions as a gate insulating film (a gate insulating film having a charge accumulating part therein) of the memory transistor. The insulating film ZF (particularly, the insulating film MZ) can be considered as an insulating film having a charge accumulating part (in this case, a hafnium silicate film HSO) therein. The insulating film ZF between the memory gate electrode MG1 and the semiconductor substrate SB (p-type well PW1) functions as the gate insulating film of the memory transistor, and the insulating film MZ between the memory gate electrode MG1 and the control gate electrode CG functions as an insulating film for insulating (electrically separating) the part between the memory gate electrode MG1 and the control gate electrode CG.

The insulating film ZF is a stacked film of an insulating film OX1a, which corresponds to the above-described interface layer OX1 of the above-described first embodiment, and the insulating film MZ, which has a similar configuration as that of the above-described first embodiment. In other words, the insulating film ZF is formed of a stacked film of the insulating film OX1a and the insulating film MZ on the insulating film OX1a. Thus, the combination of the above-described interface layer OX1 and the above-described insulating film MZ of the above-described first embodiment corresponds to the insulating film ZF.

More specifically, in the above-described first embodiment, the stacked film of the interface layer OX1 and the insulating film MZ is interposed between the semiconductor substrate SB (p-type well PW) and the gate electrode MG. On the other hand, in the present second embodiment, the insulating film ZF, which is the stacked film of the insulating film OX1$a$ corresponding to the interface layer OX1 and the insulating film MZ, is interposed between the memory gate electrode MG1 and the semiconductor substrate SB (p-type well PW1) and between the memory gate electrode MG1 and the control gate electrode CG.

In the present second embodiment, the configuration of the insulating film MZ is similar to that of the above-described first embodiment; therefore, the repeated explanation thereof will be omitted here. It is briefly described as: the insulating film MZ is formed of a stacked film of an aluminum oxide film AOX1, a hafnium silicate film HSO formed on the aluminum oxide film AOX1, and an aluminum oxide film AOX2 formed on the hafnium silicate film HSO. The compositions, dielectric constants, functions, etc. of the aluminum oxide film AOX1, hafnium silicate film HSO, and the aluminum oxide film AOX2 are similar to those of the above-described first embodiment. It will be briefly described as: the hafnium silicate film HSO is an insulating film having a charge accumulating function, in other words, a trap insulating film, and the aluminum oxide film AOX2 and the aluminum oxide film AOX1 are insulating films which function as charge block layers or charge confinement layers.

In order to facilitate viewing of the drawing, in FIG. 21, the insulating film MZ formed of the stacked film of the aluminum oxide film AOX1, the hafnium silicate film HSO, and the aluminum oxide film AOX2 is simply shown as the insulating film MZ. In practice, as shown in enlarged views of the regions surrounded by dotted-line circles in FIG. 21, the insulating film MZ is formed of the aluminum oxide film AOX1, the hafnium silicate film HSO, and the aluminum oxide film AOX2.

As described in the above-described first embodiment, also in the present second embodiment, instead of the aluminum oxide film AOX1, a silicon oxide film, a silicon oxynitride film (SiON film), an aluminum oxynitride film (AlON film), an aluminum silicate film (AlSiO film), or a hafnium aluminate film (HfAlO film) can be used as a bottom insulating film of the insulating film MZ. Also, instead of the aluminum oxide film AOX2, a silicon oxide film, a silicon oxynitride film (SiON film), an aluminum oxynitride film (AlON film), an aluminum silicate film (AlSiO film), or a hafnium aluminate film (HfAlO film) can be used as a top insulating film of the insulating film MZ.

However, as well as the above-described first embodiment, also in the present second embodiment, the aluminum oxide film AOX1 is the most preferable as the bottom insulating film of the insulating film, and the aluminum oxide film AOX2 is the most preferable as the top insulating film of the insulating film MZ.

As well as the above-described interface layer OX1, the insulating film OX1$a$ is formed of a silicon oxide film or a silicon oxynitride film. In the present second embodiment, the insulating film OX1$a$ can be omitted; however, it is more preferable that the insulating film OX1$a$ be formed. Since the insulating film OX1$a$ formed of silicon oxide or silicon oxynitride is provided, the interface between the gate insulating film of the memory transistor and (the silicon surface of) the semiconductor substrate has a $SiO_2/Si$ or $SiON/Si$ structure, the number of defects of trap levels, etc. in the interface can be reduced, and the drive performance and reliability can be improved.

In terms of manufacturing steps, the insulating film OX1$a$ is formed between the semiconductor substrate SB (p-type well PW1) and the memory gate electrode MG1 and between the memory gate electrode MG1 and the control gate electrode CG. However, a case in which the insulating film OX1$a$ is formed between the semiconductor substrate SB (p-type well PW1) and the memory gate electrode MG1, but is not formed between the memory gate electrode MG1 and the control gate electrode CG is also allowable.

The semiconductor region MS and the semiconductor region MD are semiconductor regions for a source or a drain. More specifically, the semiconductor region MS is a semiconductor region which functions as one of a source region and a drain region, and the semiconductor region MD is a semiconductor region which functions as the other one of the source region and the drain region. In this case, the semiconductor region MS is a semiconductor region which functions as the source region, and the semiconductor region MD is a semiconductor region which functions as the drain region. The semiconductor regions MS and MD consist of semiconductor regions into which an n-type impurity is introduced and are provided with LDD structures, respectively. More specifically, the semiconductor region MS for the source has an $n^-$-type semiconductor region EX1 (extension region) and an $n^+$-type semiconductor region SD1 (source region) having an impurity concentration higher than that of the $n^-$-type semiconductor region EX1. The semiconductor region MD for the drain has an $n^-$-type semiconductor region EX2 (extension region) and an $n^+$-type semiconductor region SD2 (drain region) having an impurity concentration higher than that of the $n^-$-type semiconductor region EX2.

The semiconductor region MS is a semiconductor region for a source or a drain and is formed on the semiconductor substrate SB at a position adjacent to the memory gate electrode MG1 in a gate-length direction (the gate-length direction of the memory gate electrode MG1). The semiconductor region MD is a semiconductor region for a source or a drain and is formed on the semiconductor substrate SB at a position adjacent to the control gate electrode CG in the gate-length direction (the gate-length direction of the control gate electrode CG).

Sidewalls SW formed of an insulator (insulating film) are formed on the sidewalls of the memory gate electrode MG1 and the control gate electrode CG which are in the side not adjacent to each other.

The $n^-$-type semiconductor region EX1 of a source part is formed in a self-aligning manner with respect to the memory gate electrode MG1, and the $n^+$-type semiconductor region SD1 is formed in a self-aligning manner with respect to the sidewall spacer SW on the sidewall of the memory gate electrode MG1. Therefore, in the manufactured semiconductor device, the low-concentration $n^-$-type semiconductor region EX1 is formed below the sidewall spacer SW on the sidewall of the memory gate electrode MG1, and the high-concentration $n^+$-type semiconductor region SD1 is formed outside the low-concentration $n^-$-type semiconductor region EX1. Therefore, the low-concentration $n^-$-type semiconductor region EX1 is formed so as to be adjacent to the channel region of the memory transistor, and the high-concentration $n^+$-type semiconductor region SD1 is formed so as to be adjacent to the low-concentration $n^-$-type semiconductor region EX1 and is separated from the channel region of the memory transistor by the distance of the n⁻-type semiconductor region EX1.

The n⁻-type semiconductor region EX2 of a drain part is formed in a self-aligning manner with respect to the control gate electrode CG, and the n⁺-type semiconductor region SD2 is formed in a self-aligning manner with respect to the sidewall spacer SW on the sidewall of the gate electrode CG. Therefore, in the manufactured semiconductor device, the low-concentration n⁻-type semiconductor region EX2 is formed below the sidewall spacer SW on the sidewall of the control gate electrode CG, and the high-concentration n⁺-type semiconductor region SD2 is formed outside the low-concentration n⁻-type semiconductor region EX2. Therefore, the low-concentration n⁻-type semiconductor region EX2 is formed so as to be adjacent to the channel region of the control transistor, and the high-concentration n⁺-type semiconductor region SD2 is formed so as to be adjacent to the low-concentration n⁻-type semiconductor region EX2 and separated from the channel region of the control transistor by the distance of the n⁻-type semiconductor region EX2.

The channel region of the memory transistor is formed below the insulating film MZ below the memory gate electrode MG1, and the channel region of the control transistor is formed below the insulating film GI below the control gate electrode CG.

A metal silicide layer SL is formed above the n⁺-type semiconductor regions SD1 and SD2, above the memory gate electrode MG1, and above the control gate electrode CG, for example, by salicide techniques.

Although illustration is omitted in FIG. 21, the insulating film IL1 serving as an interlayer insulating film is formed on the semiconductor substrate SB so as to cover the control gate electrode CG, the memory gate electrode MG1, and the sidewall spacers SW as shown in later-described FIG. 34. The contact holes CT are formed in the insulating film ILL and the plugs PG are buried in the contact holes CT. The insulating film IL2 and the wiring M1 are formed on the insulating film ILL in which the plugs PG are buried.

Next, operation examples of the non-volatile memory of the present second embodiment will be explained with reference to FIG. 23.

FIG. 23 is a table showing an example of the conditions of application of voltages to the parts of the selective memory cell in "program", "erase", and "read" of the present embodiment. The table of FIG. 23 describes a voltage Vmg applied to the memory gate electrode MG1 of the memory cell (selective memory cell) as shown in FIG. 21 and FIG. 22, a voltage Vs applied to the source region (semiconductor region MS), a voltage Vcg applied to the control gate electrode CG, a voltage Vd applied to the drain region (semiconductor region MD), and a voltage Vb applied to the p-type well PW1 in each case of "program", "erase", and "read". Those shown in the table of FIG. 23 are a suitable example of the condition of applying voltages, and the conditions are not limited thereto and can be variously changed in accordance with needs. In the present second embodiment, injection of electrons into the hafnium silicate film HSO, which is the charge accumulating layer (charge accumulating part) in the insulating film ZF of the memory transistor is defined as "program", and injection of holes (holes: positive holes) is defined as "erase".

As a programming method, a method in which programming is carried out by hot-electron injection by source-side injection (hot-electron-injection programming method) referred to as a so-called SSI (Source Side Injection) method can be used. For example, programming is carried out by applying the voltages as shown in the section of "program" of FIG. 23 to the parts of the selective memory cell, which carries out programming, and injecting electrons into the hafnium silicate film HSO in the insulating film ZF of the selective memory cell. In this process, hot electrons are generated in the channel regions (between the source and the drain) between the two gate electrodes (the memory gate electrode MG1 and the control gate electrode CG), and the hot electrons are injected into the hafnium silicate film HSO, which is the charge accumulating layer (charge accumulating part) in the insulating film ZF below the memory gate electrode MG1. The injected hot electrons (electrons) are captured by the trap level in the hafnium silicate film HSO in the insulating film ZF, and, as a result, the threshold voltage of the memory transistor is increased. Thus, the memory transistor becomes a programmed state.

As an erasing method, an erasing method in which erasure is carried out by hot-hole injection by BTBT (Band-To-Band Tunneling: interband tunneling phenomenon) referred to as a so-called BTBT method (hot-hole-injection erasing method) can be used. More specifically, erasure is carried out by injecting the holes (positive holes) generated by BTBT (interband tunneling phenomenon) into the charge accumulating part (the hafnium silicate film HSO in the insulating film ZF). For example, holes are injected into the hafnium silicate film HSO in the insulating film ZF of the selective memory cell by applying the voltages as shown in the section of "erase" in FIG. 23 to the parts of the selective memory cell, which is to carry out erasure, generating the holes (positive holes) by the BTBT phenomenon, and subjecting them to electric field acceleration; and, by virtue of this, the threshold voltage of the memory transistor is reduced. Thus, the memory transistor becomes an erased state.

In reading, for example, the voltages as shown in the section of "read" of FIG. 23 are applied to the parts of the selective memory cell, which is to carry out read. When the voltage Vmg applied to the memory gate electrode MG1 in read is configured to have a value between the threshold voltage of the memory transistor in a programmed state and the threshold voltage of the memory transistor in an erased state, the programmed state and the erased state can be discriminated.

Next, a method of manufacturing the semiconductor device of the present second embodiment will be explained.

FIG. 24 to FIG. 34 are cross-sectional view of main parts during manufacturing steps of the semiconductor device of the present embodiment.

Figure 24:
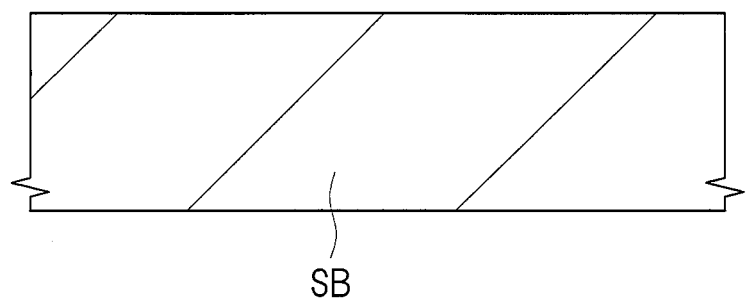
FIG. 24 is a cross-sectional view of main parts during a manufacturing step of the semiconductor device of the other embodiment.

As shown in FIG. 24, first, the semiconductor substrate SB similar to that of the above-described first embodiment is prepared. Then, isolation regions (not illustrated) which define active regions are formed in the main surface of the semiconductor substrate SB.

Figure 25:
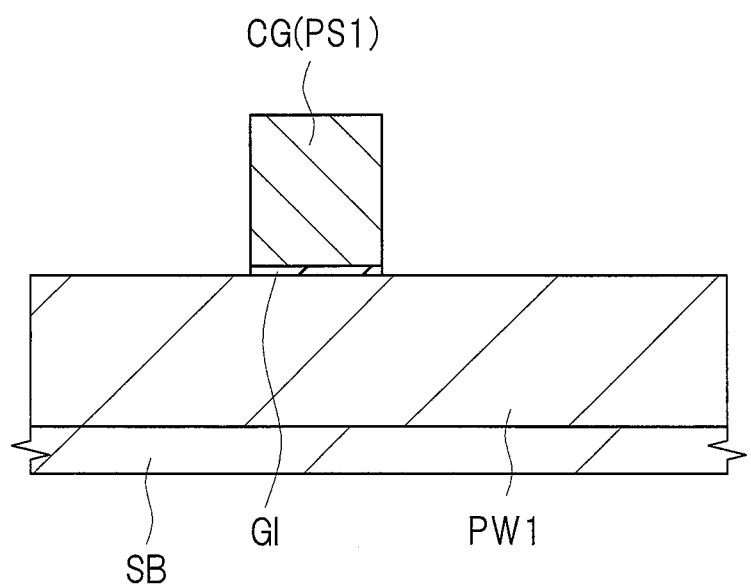
FIG. 25 is a cross-sectional view of main parts during a manufacturing step of the semiconductor device continued from FIG. 24.

Then, as shown in FIG. 25, the p-type well PW1 is formed in the semiconductor substrate SB in the memory-cell formation region. The p-type well PW1 can be formed by ion implantation and is formed in a predetermined depth from the main surface of the semiconductor substrate SB.

Then, after the surface of the semiconductor substrate SB (p-type well PW1) is purified, for example, by diluted-hydrofluoric-acid cleaning, the insulating film GI for the gate insulating film of the control transistor is formed on the main surface of the semiconductor substrate SB (the surface of the p-type well PW1). Then, after a silicon film PS1 is formed (deposited), as an electrically-conductive film for forming the control gate electrode CG, on the main surface (entire main surface) of the semiconductor substrate SB, in other words, on the insulating film GI, the silicon film PS1 is patterned by using photolithography and dry etching, thereby forming the control gate electrode CG formed of the patterned silicon film PS1.

203 The silicon film PS1 is formed of a polycrystalline silicon film (polysilicon film) and can be formed by using, for example, CVD; however, in film formation, after the silicon film PS1 is formed as an amorphous silicon film, the amorphous silicon film can be changed to a polycrystalline silicon film by thermal treatment thereafter. The silicon film PS1 has a low resistivity by introducing an n-type impurity thereinto. The silicon film PS1 can be caused to be a non-doped silicon film in the state of film formation, and an impurity can be introduced thereinto by ion implantation after the film formation. Therefore, the control gate electrode CG is formed of an n-type doped polysilicon film.

In the region in which the memory cell is to be formed, the insulating film GI excluding the part thereof covered with the control gate electrode CG (in other words, the insulating film GI excluding the part thereof which is to serve as a gate insulating film) is removed by carrying out dry etching carried out in the patterning step of the silicon film PS1 or by carrying out wet etching after dry etching.

Figure 26:
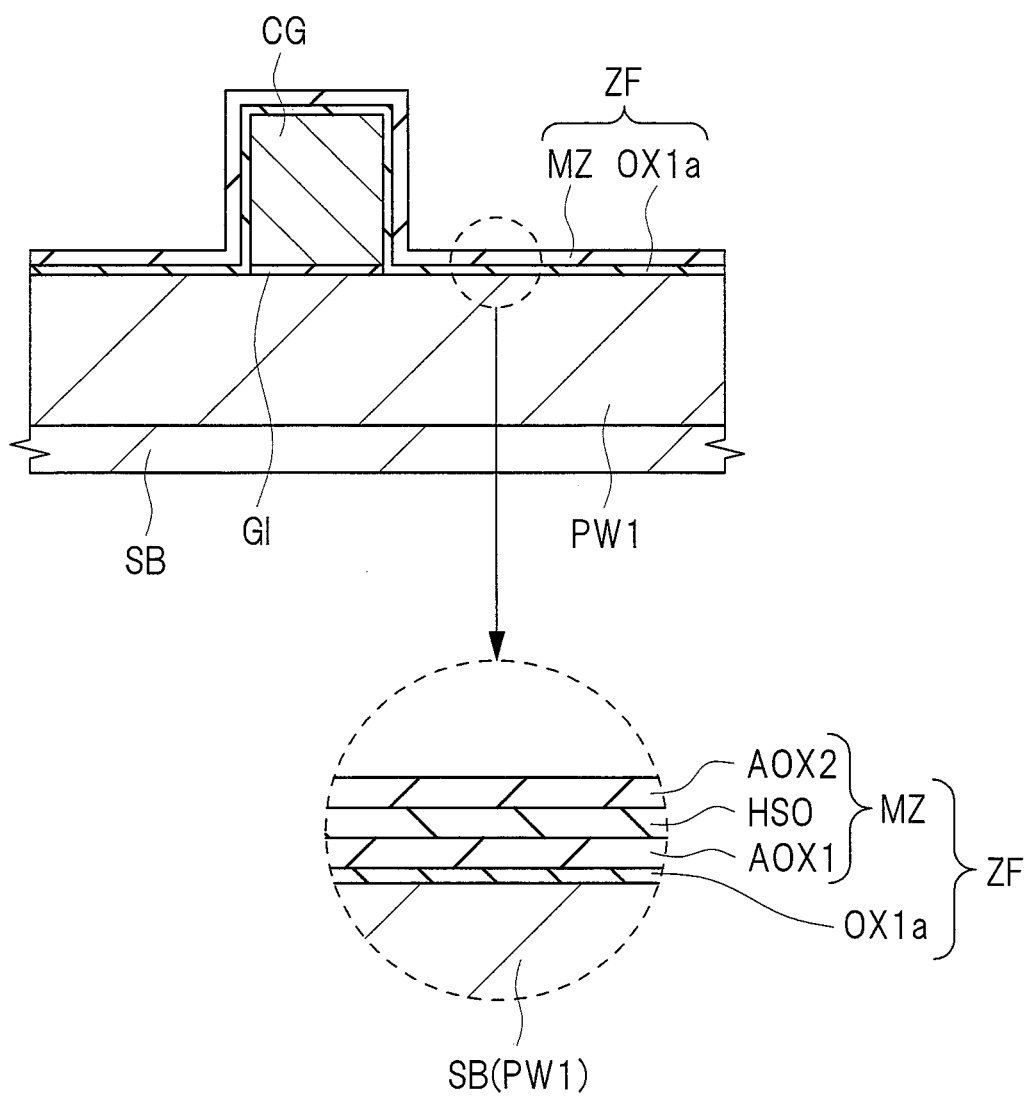
FIG. 26 is a cross-sectional view of main parts during a manufacturing step of the semiconductor device continued from FIG. 25.

Then, after the main surface of the semiconductor substrate SB undergoes purifying treatment by carrying out cleaning treatment, as shown in FIG. 26, the insulating film ZF for the gate insulating film of the memory transistor is formed on the entire main surface of the semiconductor substrate SB, in other words, on the main surface (surface) of the semiconductor substrate and on the surface (upper surface and side surfaces) of the control gate electrode CG.

The insulating film ZF is formed of a stacked film of the insulating film OX1a formed of a silicon oxide film or a silicon oxynitride film and the insulating film MZ on the insulating film OX1a.

In order to facilitate viewing of the drawing, in FIG. 26, the insulating film MZ formed of the aluminum oxide film AOX1, the hafnium silicate film HSO, and the aluminum oxide film AOX2 is simply shown as the insulating film MZ. In practice, as shown in the enlarged view surrounded by a dotted-line circle in FIG. 26, the insulating film MZ is formed of the aluminum oxide film AOX1, the hafnium silicate film HSO on the aluminum oxide film AOX1, and the aluminum oxide film AOX2 on the hafnium silicate film HSO. Therefore, the insulating film ZF is formed of the insulating film OX1a, the aluminum oxide film AOX1 on the insulating film OX1a, the hafnium silicate film HSO on the aluminum oxide film AOX1, and the aluminum oxide film AOX2 on the hafnium silicate film HSO.

Therefore, a step of forming the insulating film ZF includes a step of forming the insulating film OX1a, a step of forming the aluminum oxide film AOX1, a step of forming the hafnium silicate film HSO, and a step of forming the aluminum oxide film AOX2. The step of forming the aluminum oxide film AOX1 is carried out after the step of forming the insulating film GI, the step of forming the hafnium silicate film HSO is carried out thereafter, and the step of forming the aluminum oxide film AOX2 is carried out further thereafter. The step of forming the aluminum oxide film AOX1, the step of forming the hafnium silicate film HSO, and the step of forming the aluminum oxide film AOX2 of the present second embodiment are also similar to those of the above-described first embodiment; therefore, the repeated explanations thereof are omitted here. Also in the present second embodiment, it is desired that thermal treatment (thermal treatment for crystallization) similar to the thermal treatment of above-described step S5 be carried out. Also about the step of forming the insulating film OX1a, for example, a method similar to the step of forming the interface layer OX1 of the above-described first embodiment can be used. As described above, formation of the insulating film OX1a can be omitted; however, it is more desired that the insulating film OX1a also be formed.

Therefore, in the present second embodiment, steps similar to the above-described steps S3, S4, and S5 of the above-described first embodiment are carried out; wherein a point that the insulating film ZF is formed not only on the main surface (surface) of the semiconductor substrate SB, but also on the surface (upper surface and side surfaces) of the control gate electrode CG is different from the above-described first embodiment.

As described in the above-described first embodiment, also in the present second embodiment, instead of the aluminum oxide film AOX1, a silicon oxide film, a silicon oxynitride film (SiON film), an aluminum oxynitride film (AlON film), an aluminum silicate film (AlSiO film), or a hafnium aluminate film (HfAlO film) can be formed as a bottom insulating film of the insulating film MZ. Moreover, instead of the aluminum oxide film AOX2, a silicon oxide film, a silicon oxynitride film (SiON film), an aluminum oxynitride film (AlON film), an aluminum silicate film (AlSiO film), or a hafnium aluminate film (HfAlO film) can be formed as a top insulating film of the insulating film MZ.

Figure 27:
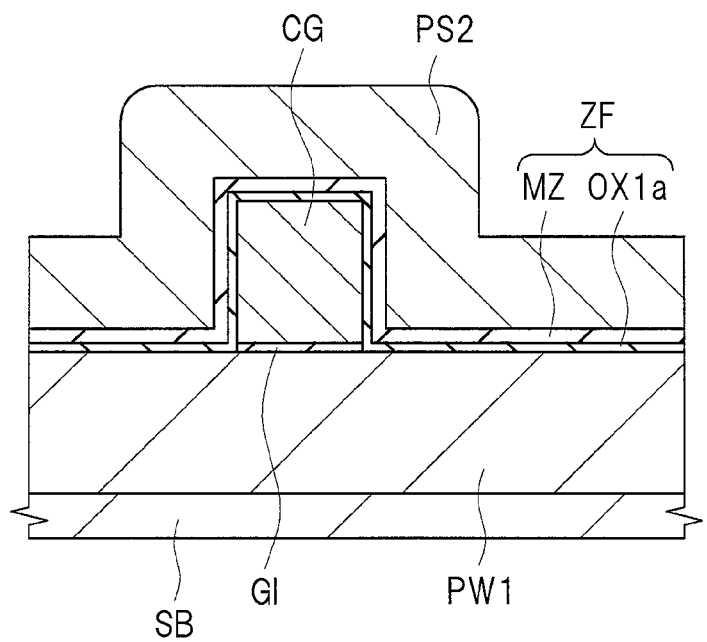
FIG. 27 is a cross-sectional view of main parts during a manufacturing step of the semiconductor device continued from FIG. 26.

Then, as shown in FIG. 27, a silicon film PS2 serving as an electrical conductor film for forming the memory gate electrode MG1 is formed (deposited) on the main surface (entire main surface) of the semiconductor substrate SB, in other words, on the insulating film ZF so as to cover the control gate electrode CG.

The silicon film PS2 is formed of a polycrystalline silicon film and can be formed by using, for example, CVD. In film formation, after the silicon film PS2 is formed as an amorphous silicon film, the amorphous silicon film can be changed to a polycrystalline silicon film by thermal treatment thereafter. The silicon film PS2 has a low resistivity since an n-type impurity is introduced thereinto. The n-type impurity can be introduced into the silicon film PS2 in ion implantation after the film formation of the silicon film PS2; however, the n-type impurity can be also introduced into the silicon film PS2 in film formation of the silicon film PS2.

Figure 28:
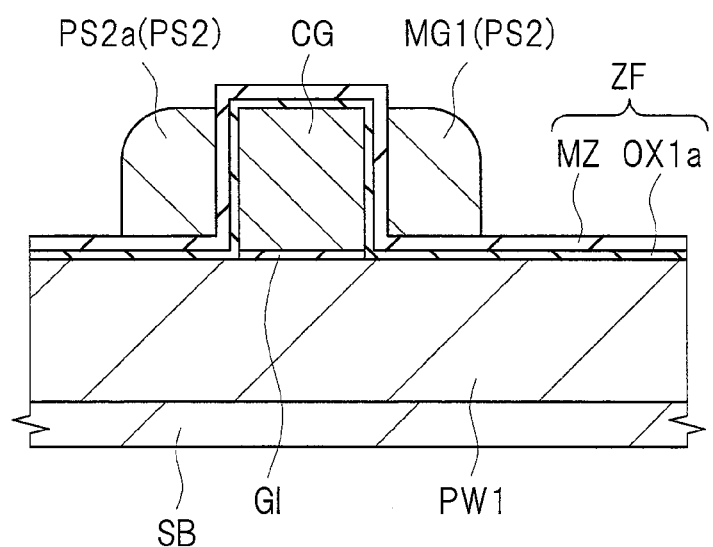
FIG. 28 is a cross-sectional view of main parts during a manufacturing step of the semiconductor device continued from FIG. 27.

Then, the silicon film PS2 is subjected to etch back (etching, dry etching, anisotropic etching) by anisotropic etching techniques. In this etch back step, the silicon film PS2 is subjected to etch back by anisotropic etching by the amount of the deposited film thickness of the silicon film PS2, thereby causing the silicon film PS2 to remain in the shapes of sidewall spacers on the both sidewalls of the control gate electrode CG (via the insulating film ZF) and removing the silicon film PS2 in the other regions. As a result, as shown in FIG. 28, the memory gate electrode MG1 is formed on one of the sidewalls among the both sidewalls of the control gate electrode CG via the insulating film ZF by the silicon film PS2 remaining in the shape of a sidewall spacer via the insulating film ZF, and, also, a silicon spacer PS2a is formed on the other sidewall via the insulating film ZF by the silicon film PS2 remaining in the shape of a sidewall spacer. The memory gate electrode MG1 is formed on the insulating film ZF so as to be adjacent to the control gate electrode CG via the insulating film ZF. When the memory gate electrode MG1 and the silicon spacer PS2a are formed by carrying out the etch back step of the silicon film PS2, the insulating film ZF in the region which is not covered with the memory gate electrode MG1 and the silicon spacer PS2a is exposed.

Figure 29:
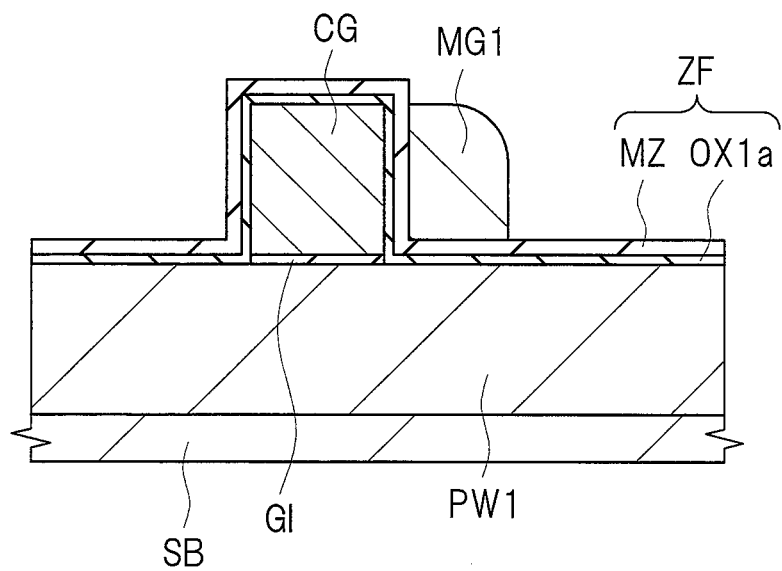
FIG. 29 is a cross-sectional view of main parts during a manufacturing step of the semiconductor device continued from FIG. 28.

Then, after a photoresist pattern (not illustrated) is formed on the semiconductor substrate SB by using photolithography techniques so as to cover the memory gate electrode MG and expose the silicon spacer PS2a, the silicon spacer PS2a is removed by dry etching using this photoresist pattern as an etching mask. Then, the photoresist pattern is removed, and FIG. 29 illustrates this stage. The silicon spacer PS2a is removed by this etching step as shown in FIG. 29; however, the memory gate electrode MG1 remains without being etched since it was covered with the photoresist pattern.

Figure 30:
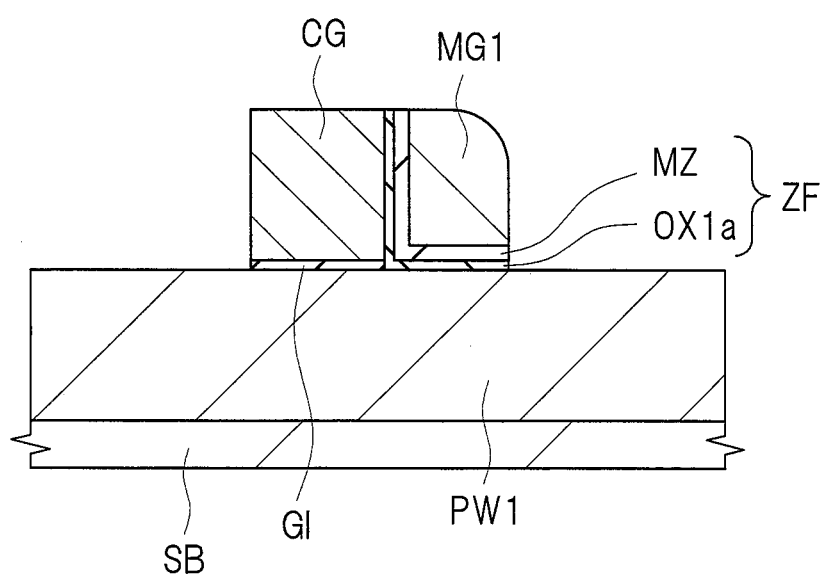
FIG. 30 is a cross-sectional view of main parts during a manufacturing step of the semiconductor device continued from FIG. 29.

Then, as shown in FIG. 30, the part of the insulating film ZF exposed without being covered with the memory gate electrode MG1 is removed by etching (for example, wet etching). In this process, the insulating film ZF positioned below the memory gate electrode MG1 and between the memory gate electrode MG1 and the control gate electrode CG remains without being removed, and the insulating film ZF in the other region is removed. As is also understood from FIG. 30, the insulating film ZF is continuously extended across both of the regions of the region between the memory gate electrode MG1 and the semiconductor substrate SB (p-type well PW1) and the region between the memory gate electrode MG1 and the control gate electrode CG.

Figure 31:
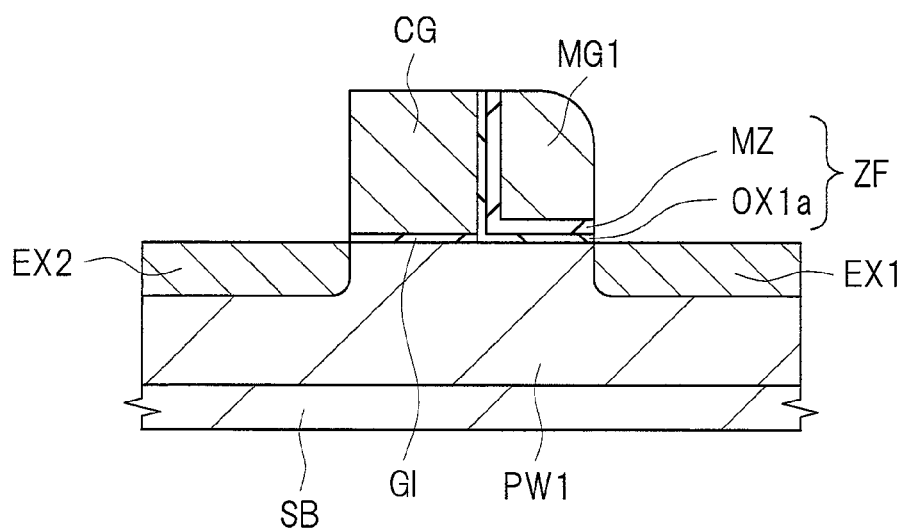
FIG. 31 is a cross-sectional view of main parts during a manufacturing step of the semiconductor device continued from FIG. 30.

Then, an n-type impurity is introduced into the semiconductor substrate SB (p-type well PW1) by using, for example, ion implantation while using the control gate electrode CG and the memory gate electrode MG1 as a mask (ion-implantation preventing mask); as a result, as shown in FIG. 31, the n⁻-type semiconductor regions (impurity diffusion layers) EX1 and EX2 are formed.

In this process, the n⁻-type semiconductor region EX1 is formed to be self-aligned on the sidewall of the memory gate electrode MG1 (the sidewall in the side opposite to the side adjacent to the gate electrode CG via the insulating film ZF). Also, the n⁻-type semiconductor region EX2 is formed to be self-aligned on the sidewall of the control gate electrode CG (the sidewall in the side opposite to the side adjacent to the memory gate electrode MG1 via the insulating film ZF). The n⁻-type semiconductor region EX1 and the n⁻-type semiconductor region EX2 can be formed in a single ion implantation step, but can be also formed in different ion implantation steps.

Figure 32:
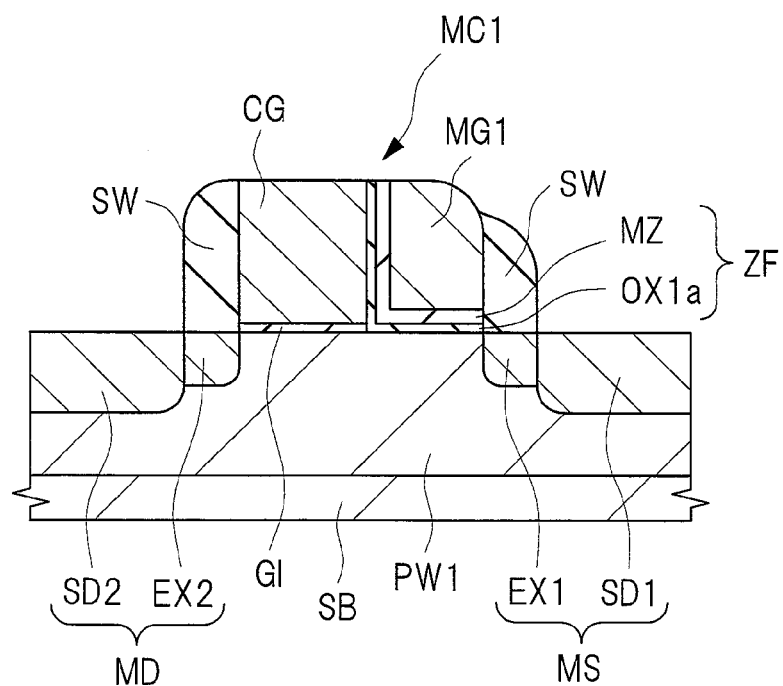
FIG. 32 is a cross-sectional view of main parts during a manufacturing step of the semiconductor device continued from FIG. 31.

Then, as shown in FIG. 32, the sidewall spacers SW formed of an insulating film are formed as a sidewall insulating film on the sidewalls of the control gate electrode CG and the memory gate electrode MG1 (the sidewalls in the side opposite to the mutually adjacent side via the insulating film ZF). The sidewall spacers SW can be formed, for example, by forming an insulating film for forming the sidewall spacers SW on the entire main surface of the semiconductor substrate SB so as to cover the control gate electrode CG and the memory gate electrode MG1 and then subjecting the insulating film to etch back by anisotropic etching techniques. The sidewall spacers SW are formed on, among the sidewalls of the control gate electrode CG, the sidewall in the opposite side of the sidewall that is in the side adjacent to the memory gate electrode MG1 via the insulating film ZF and on, among the sidewalls of the memory gate electrode MG1, the sidewall in the opposite side of the sidewall in the side that is adjacent to the control gate electrode CG via the insulating film ZF.

Then, the n⁺-type semiconductor regions SD1 and SD2 are formed by introducing an n-type impurity into the semiconductor substrate SB (p-type well PW1) by using the control gate electrode CG, the memory gate electrode MG1, and the sidewall spacers SW on the sidewalls thereon as a mask (ion-implantation preventing mask) by using, for example, ion implantation.

In this process, the n⁺-type semiconductor region SD1 is formed to be self-aligned with the sidewall spacer SW on the sidewall of the memory gate electrode MG, and the n⁺-type semiconductor region SD2 is formed to be self-aligned with the sidewall spacer SW on the sidewall of the control gate electrode CG. As a result, LDD structures are formed. The n⁺-type semiconductor region SD1 and the n⁺-type semiconductor region SD2 can be formed in a single ion implantation step, but can be formed in different ion implantation steps.

In this manner, the n-type semiconductor region MS which functions as the source region of the memory transistor is formed of the n⁻-type semiconductor region EX1 and the n⁺-type semiconductor region SD1 having a higher impurity concentration than that, and the n-type semiconductor region MD which functions as the drain region of the control transistor is formed of the n⁻-type semiconductor region EX2 and the n⁺-type semiconductor region SD2 having a higher impurity concentration than that.

Then, activation annealing, which is thermal treatment for activating the impurities introduced into, for example, the semiconductor regions for the source and the drain (the n⁻-type semiconductor regions EX1 and EX2 and the n⁺-type semiconductor regions SD1 and SD2), is carried out.

In this manner, the memory element MC1 of the non-volatile memory is formed.

Figure 33:
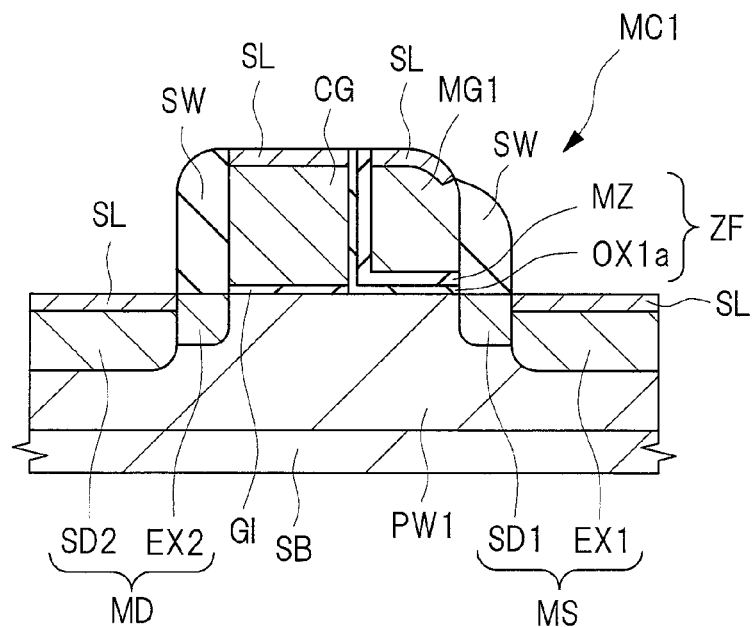
FIG. 33 is a cross-sectional view of main parts during a manufacturing step of the semiconductor device continued from FIG. 32.

Then, the metal silicide layer SL is formed as shown in FIG. 33 by carrying out a salicide process as explained in the above-described first embodiment. The metal silicide layer SL can be formed above the n⁺-type semiconductor regions SD1 and SD2, the control gate electrode CG, and the memory gate electrode MG1, and, by virtue of this, the resistances of the source, the drain, and the gate electrodes (CG, MG1) can be reduced.

The steps of the present second embodiment after this is also basically the same as those of the above-described first embodiment.

Figure 34:
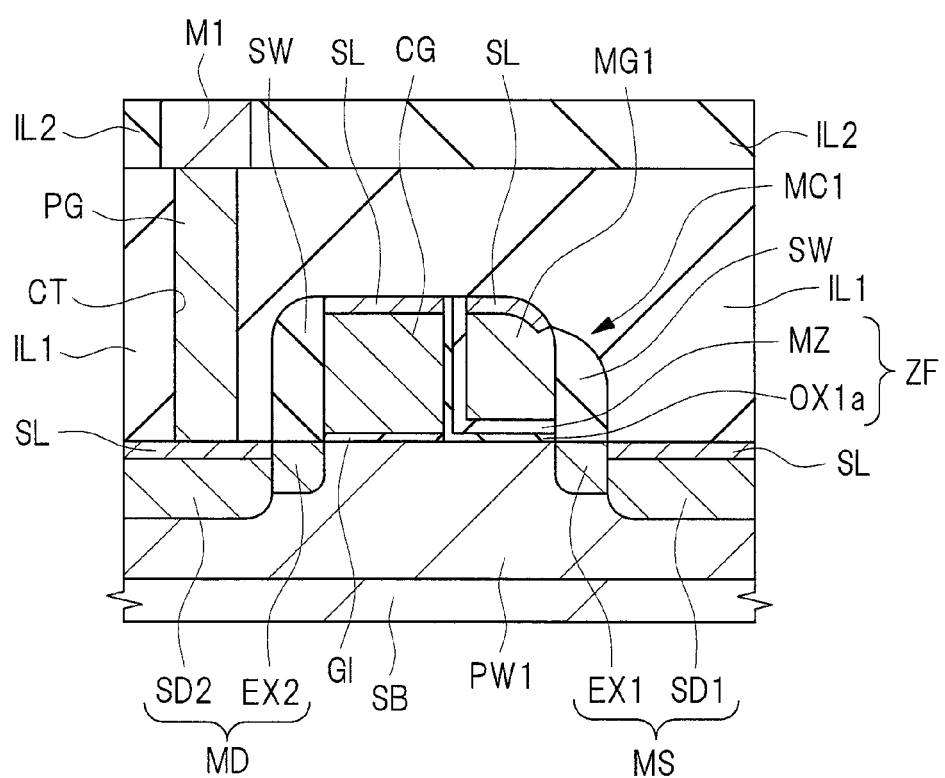
FIG. 34 is a cross-sectional view of main parts during a manufacturing step of the semiconductor device continued from FIG. 33.

More specifically, as shown in FIG. 34, the insulating film IL1 is formed as an interlayer insulating film so as to cover the control gate electrode CG, the memory gate electrode MG1, and the sidewall spacer SW. After the insulating film IL1 is formed, the upper surface of the insulating film IL1 is planarized by using, for example, CMP in accordance with needs. Then, after the contact holes CT are formed in the insulating film IL1 by using photolithography techniques and dry etching techniques, and the electrically-conductive plugs PG are formed in the contact holes CT as well as the above-described first embodiment. Then, as well as the above-described first embodiment, after the insulating film IL2 is formed on the insulating film IL1 in which the plugs PG are buried, wiring grooves are formed in the insulating film IL2, and the wiring M1 is then formed in the wiring grooves.

Then, the wiring of a second layer and thereafter is formed by, for example, dual damascene; however, illustration and explanations thereof are omitted here. The wiring M1 and the wiring in the layer(s) thereabove is not limited to damascene wiring, but can be formed by patterning an electrically-conductive film for wiring, and the wiring can be, for example, tungsten wiring or aluminum wiring.

In the above-described manner, the semiconductor device of the present second embodiment is manufactured.

One of the main characteristics of the semiconductor device of the present second embodiment is that the insulating film (trap insulating film) having the charge accumulating function in the gate insulating film (in this case, the insulating film ZF or the insulating film MZ) of the memory transistor is a high-dielectric constant insulator film and contains hafnium, silicon, and oxygen. More specifically, the gate insulating film (in this case, the insulating film ZF or the insulating film MZ) of the memory transistor has a first insulating film (in this case, the aluminum oxide film AOX1), a second insulating film (in this case, the hafnium silicate film HSO) on the first insulating film, and a third insulating film (in this case, the aluminum oxide film AOX2) on the second insulating film. Then, the second insulating film (in this case, the hafnium silicate film HSO) is a high-dielectric constant insulator film having a charge accumulating function (in other words, a trap insulating film formed of a high-dielectric constant film) and contains hafnium, silicon, and oxygen. The band gap of each of the first insulating film (in this case, the aluminum oxide film AOX1) and the third insulating film (in this case, the aluminum oxide film AOX2) is larger than the band gap of the second insulating film (in this case, the hafnium silicate film HSO).

In the present second embodiment, the trap insulating film (in this case, the hafnium silicate film HSO) in the gate insulating film (in this case, the insulating film ZF or the insulating film MZ) of the memory transistor is a high-dielectric constant insulator film containing hafnium, silicon, and oxygen; therefore, the physical film thickness of the trap insulating film can be increased (thickened) while suppressing EOT of the trap insulating film. By virtue of this, as explained also in the above-described first embodiment, the charge retaining characteristics of the memory element can be improved. Therefore, the performance of the semiconductor device can be improved. The high-dielectric constant insulator film (in this case, the hafnium silicate film HSO) containing hafnium, silicon, and oxygen has a higher dielectric constant (relative permittivity) than those of silicon nitrides.

Moreover, since EOT of the trap insulating film can be suppressed, EOT of the gate insulating film (in this case, the insulating film ZF or the insulating film MZ) of the memory transistor can be suppressed; therefore, for example, reduction of operating voltages (program voltage or erasure voltage) is enabled. Moreover, the operating speed of the memory element can be improved.

Moreover, power consumption can be reduced. Moreover, since programming time or reading time of data can be shortened with a low drive voltage, the speed of processing data can be increased. Therefore, the performance of the semiconductor device can be improved.

Moreover, in the present second embodiment, it is more preferable that the gate insulating film of the memory transistor be a high-dielectric constant gate insulating film. More specifically, the gate insulating film of the memory transistor has the first insulating film (in this case, the aluminum oxide film AOX1), the second insulating film (in this case, the hafnium silicate film HSO) on the first insulating film, and the third insulating film (in this case, the aluminum oxide film AOX2) on the second insulating film. It is preferable that the first insulating film, the second insulating film, and the third insulating film be high-dielectric constant insulator films, respectively. In other words, it is preferable that the gate insulating film of the memory transistor have a stacked structure in which the second high-dielectric constant insulator film (in this case, the hafnium silicate film HSO) having the charge accumulating function is sandwiched by the third high-dielectric constant insulator film (in this case, the aluminum oxide film AOX2) and the first high-dielectric constant insulator film (in this case, the aluminum oxide film AOX1). All of the first high-dielectric constant insulator film, the second high-dielectric constant insulator film, and the third high-dielectric constant insulator film are high-dielectric constant insulator films having higher dielectric constants than those of silicon oxides.

If, different from the present second embodiment, an ONO film serving as the gate insulating film of the memory transistor is employed, EOT of the gate insulating film becomes large since the dielectric constant thereof is comparatively low.

In the present second embodiment, the high-dielectric constant gate insulating film is employed as the gate insulating film of the memory transistor; therefore, compared with the case in which the high-dielectric constant gate insulating film is not employed (in other words, the ONO film is employed), EOT of the gate insulating film can be reduced by the amount of the high dielectric constant. Therefore, while suppressing EOT of the films of the gate insulating film of the memory transistor, the physical film thickness thereof can be increased. By virtue of this, deterioration of the retaining characteristics (retention characteristics) due to leak can be prevented, and the retaining characteristics can be improved. Moreover, EOT can be reduced while the physical film thicknesses of the films of the gate insulating film of the memory transistor are ensured. By virtue of this, while deterioration of the retaining characteristics (retention characteristics) due to leak is prevented, for example, reduction of the operating voltage is enabled. Moreover, the operating speed can be improved. Moreover, power consumption can be reduced. Moreover, since the programming time and erasing time of data can be shortened even with a low driving voltage, the speed of processing data can be increased. Therefore, the performance of the semiconductor device can be improved.

Moreover, in the memory element MC1 of the present second embodiment, the insulating film MZ is extended not only between the semiconductor substrate SB (p-type well PW1) and the memory gate electrode MG1, but also between the control gate electrode CG and the memory gate electrode MG1. Therefore, since the insulating film MZ is the high-dielectric constant insulator film, the physical film thickness thereof can be increased while EOT of the insulating film interposed between the control gate electrode CG and the memory gate electrode MG1 is suppressed; therefore, the withstand voltage between the control gate electrode CG and the memory gate electrode MG1 can be improved.

More specifically, when the present second embodiment and the case in which the high-dielectric constant gate insulating film of the memory transistor is not employed (in other words, the case in which the ONO film is employed) are compared with an assumption that EOT of the gate insulating film is the same, the physical film thickness of the gate insulating film is thicker in the present second embodiment; therefore, the thickness of the insulating film interposed between the control gate electrode CG and the memory gate electrode MG1 is thicker in the present second embodiment. The increase in the physical thickness of the insulating film interposed between the control gate electrode CG and the memory gate electrode MG1 leads to an increased withstand voltage between the control gate electrode CG and the memory gate electrode MG1. Therefore, in the present second embodiment, since the insulating film MZ is a high-dielectric constant insulator film, the physical film thickness thereof can be increased while EOT of the insulating film interposed between the control gate electrode CG and the memory gate electrode MG1 is suppressed, the withstand voltage between the control gate electrode CG and the memory gate electrode MG1 can be improved.

Moreover, in the present second embodiment, since the insulating film MZ is a high-dielectric constant insulator film, the physical film thickness thereof can be increased while EOT of the insulating film interposed between the semiconductor substrate SB (p-type well PW1) and the memory gate electrode MG1 is suppressed, the withstand voltage between the memory gate electrode MG1 and the source region (semiconductor region MS) can be improved.

In the gate insulating film of the memory transistor, each of the third insulating film (in this case, the aluminum oxide film AOX2) positioned above/below the second insulating film (in this case, the hafnium silicate film HSO) having the charge accumulating function and the first insulating film (in this case, the aluminum oxide film AOX1) has to have a larger band gap than the band gap of the second insulating film so as to be able to function as a charge block layer. This is similar also in the present second embodiment as well as the above-described first embodiment. Therefore, as well as the above-described first embodiment, also in the present second embodiment, aluminum oxide films, silicon oxide films, silicon oxynitride films (SiON films), aluminum oxynitride films (AlON films), aluminum silicate films (AlSiO films), or hafnium aluminate films (HfAlO films) can be suitably used as the first insulating film and the third insulating film which function as charge block layers (or charge confinement layers).

Also in the present second embodiment, it is preferable that the first insulating film and the third insulating film which function as the charge block layers (or the charge confinement layers) have high dielectric constants, and, by virtue of this, the physical film thicknesses of the first insulating film and the third insulating film can be increased while the EOT of the first insulating film and the third insulating film is suppressed; therefore, effects as described above can be precisely obtained. From this viewpoint, also in the present second embodiment, it is more preferable that aluminum oxide films, aluminum oxynitride films (AlON films), aluminum silicate films (AlSiO films), or hafnium aluminate films (HfAlO films) be used as the first insulating film and the third insulating film which function as the charge block layers (or charge confinement layers), thereby increasing the dielectric constants of the first insulating film and the third insulating film precisely.

Furthermore, also in the present second embodiment, as well as the above-described first embodiment, aluminum oxide films are the most preferable as the first insulating film and the third insulating film which function as the charge block layers (or the charge confinement layers). More specifically, the aluminum oxide film AOX1 is the most preferable as the first insulating film, and the aluminum oxide film AOX2 is the most preferable as the third insulating film. By virtue of this, the first insulating film and the third insulating film can more precisely function as the charge block layers (or the charge confinement layers), respectively, and the dielectric constants of the first insulating film and the third insulating film can be more precisely increased.

Moreover, another one of the main characteristics of the semiconductor device of the present second embodiment is the composition of the second insulating film (in this case, the hafnium silicate film HSO) having the charge accumulating function. This is similar to the above-described first embodiment, and, by virtue of this, effects approximately similar to those of the above-described first embodiment can be obtained.

More specifically, also in the present second embodiment, the composition of the trap insulating film (in this case, the hafnium silicate film HSO) in the memory transistor is similar to that of the above-described first embodiment; therefore, the trapping charge density of the trap insulating film can be increased. By virtue of this, the performance of the semiconductor device having the non-volatile memory can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
    a semiconductor substrate;
    a gate insulating film for a memory element formed on the semiconductor substrate; and
    a gate electrode for the memory element formed on the gate insulating film,
    wherein the gate insulating film has a first insulating film, a second insulating film on the first insulating film, and a third insulating film on the second insulating film,
    the second insulating film has a charge accumulating function and contains hafnium, silicon, and oxygen,
    a dielectric constant of the second insulating film is higher than that of silicon nitride,
    each of the first insulating film and the third insulating film has a band gap larger than a band gap of the second insulating film, and
    wherein:
    the second insulating film includes a hafnium oxide of orthorhombic crystal structure,
    when the atomic ratio of hafnium and silicon in the second insulating film is x:y, the condition $0.79 \leq x/(x+y) \leq 0.87$ is satisfied, and
    in said second insulating film, a charge trapping density is from about $5.0 \times 10^{-6}$ C/cm$^2$ to about $5.5 \times 1.0^{-6}$ C/cm$^2$.

2. The semiconductor device according to claim 1, wherein each of the first insulating film and the third insulating film is a high-dielectric constant film.

3. The semiconductor device according to claim 2, wherein each of the first insulating film and the third insulating film is an aluminum oxide film.

4. The semiconductor device according to claim 3, further comprising
    an interface layer formed at an interface between the gate insulating film and the semiconductor substrate and formed of a silicon oxide or a silicon oxynitride.

5. The semiconductor device according to claim 1, wherein the second insulating film is a hafnium silicate film.

6. The semiconductor device according to claim 1, further comprising
    a semiconductor region for a source or a drain for the memory element, the semiconductor region being formed in the semiconductor substrate.

7. The semiconductor device of claim 1, wherein said second insulating film has a thickness of from about 10 nm to about 15 nm.

8. The semiconductor device of claim 1, wherein said second insulating film has a thickness of about 10 nm.

* * * * *